United States Patent
Chen et al.

(10) Patent No.: US 10,210,920 B1
(45) Date of Patent: Feb. 19, 2019

(54) MAGNETIC TUNNEL JUNCTION (MTJ) DEVICES WITH VARIED BREAKDOWN VOLTAGES IN DIFFERENT MEMORY ARRAYS FABRICATED IN A SAME SEMICONDUCTOR DIE TO FACILITATE DIFFERENT MEMORY APPLICATIONS

(71) Applicant: QUALCOMM Incorporated, San Diego, CA (US)

(72) Inventors: Wei-Chuan Chen, San Diego, CA (US); Xia Li, San Diego, CA (US); Wah Nam Hsu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/937,317

(22) Filed: Mar. 27, 2018

(51) Int. Cl.
 *H01L 43/08* (2006.01)
 *G11C 11/00* (2006.01)
 *H01L 27/22* (2006.01)
 *H01L 43/12* (2006.01)
 (Continued)

(52) U.S. Cl.
 CPC .......... *G11C 11/005* (2013.01); *G11C 11/161* (2013.01); *G11C 17/16* (2013.01); *H01L 27/228* (2013.01); *H01L 43/08* (2013.01); *H01L 43/12* (2013.01)

(58) Field of Classification Search
 CPC ..... G11C 11/005; G11C 17/16; G11C 11/161; H01L 43/08; H01L 43/12; H01L 27/228
 See application file for complete search history.

(56) References Cited

U.S. PATENT DOCUMENTS

| 8,625,338 B2 * | 1/2014 | Zhu ........................ G11C 11/16 365/171 |
| 9,245,610 B2 | 1/2016 | Kim et al. |
| 2004/0082081 A1 | 4/2004 | Sharma |

(Continued)

OTHER PUBLICATIONS

Jan, Guenole et al., "Demonstration of an MgO Based Anti-Fuse OTP Design Integrated With a Fully Functional STT-MRAM at the Mbit Level," 2015 Symposium on VLSI Technology Digest of Technical Papers, Jun. 16, 2015, IEEE, pp. T164-T165.

*Primary Examiner* — David Vu
(74) *Attorney, Agent, or Firm* — W&T/Qualcomm

(57) ABSTRACT

Magnetic tunnel junction (MTJ) devices with varied breakdown voltages in different memory arrays fabricated in a same semiconductor die to facilitate different memory applications are disclosed. In exemplary aspects disclosed herein, MTJ devices are fabricated in a semiconductor die to provide at least two different memory arrays. MTJ devices in each memory array are fabricated to have different breakdown voltages. For example, it may be desired to fabricate a One-Time-Programmable (OTP) memory array in the semiconductor die using MTJ devices having a first, lower breakdown voltage, and a separate magneto-resistive random access memory (MRAM) in a same semiconductor die with MTJ devices having a higher breakdown voltage. Thus, in this example, lower breakdown voltage MTJ devices in OTP memory array require less voltage to program, while higher breakdown voltage MTJ devices in MRAM can maintain a desired write operation margin to avoid or reduce write operations causing dielectric breakdown.

31 Claims, 27 Drawing Sheets

(51) Int. Cl.
*G11C 11/16* (2006.01)
*G11C 17/16* (2006.01)

(56) References Cited

U.S. PATENT DOCUMENTS

| | | |
|---|---|---|
| 2007/0194323 A1 | 8/2007 | Takano et al. |
| 2010/0091546 A1 | 4/2010 | Liu et al. |
| 2016/0293268 A1 | 10/2016 | Jan et al. |
| 2016/0378591 A1 | 12/2016 | Naeimi et al. |

\* cited by examiner

MAGNETIC TUNNEL JUNCTION (MTJ) DEVICES WITH VARIED BREAKDOWN VOLTAGES IN DIFFERENT MEMORY ARRAYS FABRICATED IN A SAME SEMICONDUCTOR DIE TO FACILITATE DIFFERENT MEMORY APPLICATIONS

BACKGROUND

I. Field of the Disclosure

The technology of the disclosure relates generally to magnetic tunnel junction (MTJ) devices, and more particularly to employing MTJs in memory bit cells to provide a magneto-resistive random access memory (MRAM).

II. Background

In this regard, a magnetic tunnel junction (MTJ) comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written to and stored in the MTJ by applying a magnetic field to change the orientation of the free layer to either a P or AP magnetic orientation with respect to the pinned layer.

Recent developments in MTJ devices involve spin transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an MTJ 100, which in this example is an STT MTJ. The MTJ 100 is provided as part of an MRAM bit cell 102 to store non-volatile data. A metal-oxide semiconductor (MOS) (typically n-type MOS, i.e., NMOS) access transistor 104 is provided to control reading and writing to the MTJ 100. A drain D of the access transistor 104 is coupled to a bottom electrode 106 of the MTJ 100, which is coupled to a pinned layer 108 for example. A word line WL is coupled to a gate G of the access transistor 104. A source S of the access transistor 104 is coupled to a voltage source $V_S$ through a source line SL. The voltage source $V_S$ provides a source line voltage $V_{SL}$ on the source line SL. A bit line BL is coupled to a top electrode 110 of the MTJ 100, which is coupled to a free layer 112 for example. The pinned layer 108 and the free layer 112 are separated by a tunnel barrier 114. The pinned layer 108, the tunnel barrier 114, and the free layer 112 form an MTJ stack 116.

With continuing reference to FIG. 1, when writing data to the MTJ 100, the gate G of the access transistor 104 is activated by activating the word line WL. A voltage differential between a bit line voltage $V_{BL}$ on the bit line BL and the source line voltage $V_{SL}$ on the source line SL is applied. As a result, a write current $I_W$ is generated between the drain D and the source S of the access transistor 104. If the magnetic orientation of the MTJ 100 in FIG. 1 is to be changed from AP to P, a write current $I_{AP-P}$ flowing from the free layer 112 to the pinned layer 108 is generated. This induces an STT at the free layer 112 to change the magnetic orientation of the free layer 112 to P with respect to the pinned layer 108. If the magnetic orientation is to be changed from P to AP, a current $I_{P-AP}$ flowing from the pinned layer 108 to the free layer 112 is produced, which induces an STT at the free layer 112 to change the magnetic orientation of the free layer 112 to AP with respect to the pinned layer 108. When reading data from the MTJ 100, a voltage differential is again applied between the bit line voltage $V_{BL}$ on the bit line BL and the source line voltage $V_{SL}$ on the source line SL to generate a read current $I_R$. The resistance of the MTJ 100 can be deduced from the amplitude of the read current $I_R$ to read the memory state stored in the MTJ 100. The applied voltage differential is less than applied for a write operation so that the read current $I_R$ does not switch the magnetic orientation of the free layer 112 and change the memory state of the MTJ 100.

MTJ devices, such as the MTJ 100 in FIG. 1 above, can be used as bit cells in both One-Time-Programmable (OTP) memory and random access memory (RAM) for general memory applications. MRAM memories may be employed for cache and/or system memories. OTP memories may be employed for security applications, because their bit cells can only be programmed once and cannot then be changed. An OTP memory is a memory comprised of non-volatile memory bit cells where the setting of the memory state is through a one-time programming through a fuse or anti-fuse operation. For example, a fuse operation is the application of a sufficient high current flow through a metal or polysilicon material of a memory bit cell to create an open circuit. An example of an anti-fuse operation is the application of a sufficient high gate-to-source voltage to a transistor to break down a gate oxide layer and create a short circuit between the gate and source.

The same MTJ fabrication processes can be used to fabricate both MTJ-based OTP memory devices and MRAM devices on the same semiconductor die for efficiency. However, there may be different specifications for MTJ devices based on whether they are employed as OTP memory devices or MRAM devices. One specification difference between MTJ-based OTP memory devices and MRAM devices may be their breakdown voltage. Breakdown voltage is the voltage at which a dielectric layer used as the tunnel barrier for the MTJ device is stressed, such that it electrically breaks down and becomes a short. A dielectric breakdown condition is irreversible. For example, it may be desired to fabricate an MTJ-based OTP memory device to have a lower breakdown voltage (e.g., 1.2 Volts (V)) than the breakdown voltage of an STT-MRAM device (e.g., 1.6 V). Providing a lower breakdown voltage for MTJ-based OTP memory devices may be desired to lower supply voltage requirements for programming. Scaling down of semiconductor devices to increase their density in IC chips can involve lowering the supply voltage available in the integrated circuit (IC) chips to manage thermal considerations and also to conserve power. It may also be desired to lower the breakdown voltage for OTP memory devices, because scaled-down transistors used to program OTP memory devices may have less drive strength. However, it may be desired to have a higher breakdown voltage for MRAM devices to increase the margin between write voltage distribution and breakdown voltage distribution so that write operations do not cause tunnel barrier breakdown in the MTJ 100. For example, FIG. 2 is a graph 200 illustrating an exemplary voltage distribution for the MTJ 100 in FIG. 1. The graph 200 includes a write voltage distribution 202 for switching from a P to AP magnetization state, a breakdown voltage distribution 204, and an open circuit voltage distribution 206 for the MTJ 100. As shown therein, there is a gap G to provide margin between a statistical highest voltage region 208 in the write voltage distribution 202 and a statistical lowest voltage region 210 of the breakdown voltage distribution 204. The lower the breakdown voltage distribution 204, the greater likelihood that a write operation will generate a voltage that could cause dielectric breakdown in the MTJ 100, thereby leading to endurance issues. A higher breakdown voltage in MTJs of an MRAM is directly related to a higher endurance of the MTJs in terms of the number of reliable write operations rated for the MTJs.

Thus, fabricating MTJ-based OTP memory devices and MRAM devices on the same chip or die for different may not be possible due to the different breakdown voltage specifications needed or desired for each type of memory device. Fabricating MTJ devices for MTJ-based OTP and MRAM devices on the same chip or die can cause issues in that either the lower breakdown voltage of the MTJ-based OTP devices does not provide sufficient write voltage margin for the MRAM devices, or increasing the breakdown voltage to increase write voltage margin for the MRAM devices requires a higher voltage to program the MTJ-based OTP devices.

SUMMARY OF THE DISCLOSURE

Aspects disclosed herein magnetic tunnel junction (MTJ) devices with varied breakdown voltages in different memory arrays fabricated in a same semiconductor die to facilitate different memory applications. It can be advantageous to fabricate MTJ devices for memory applications in a semiconductor die using the same fabrication processes. However, different memories employing MTJ devices for memory bit cells may require different tradeoffs between breakdown voltage and endurance. The breakdown voltage of an MTJ is the applied voltage at which a dielectric tunnel barrier in the MTJ device is stressed such that it electrically breaks down and becomes a short circuit. Thus, in exemplary aspects disclosed herein, MTJ devices are fabricated in a semiconductor die to provide at least two different memory arrays. The MTJ devices in each memory array are fabricated to have different breakdown voltages. For example, the breakdown voltage of an MTJ device can be varied by controlling defects in a fabricated MTJ stack that are then processed to form MTJ devices. For example, it may be desired to fabricate a One-Time-Programmable (OTP) memory array using MTJ devices having a first breakdown voltage, and a separate magneto-resistive random access memory (MRAM) with MTJ devices having a higher breakdown voltage. Thus, MTJ devices in the OTP memory array having lower breakdown voltages require less voltage energy to program, which may be advantageous for example to allow for lower supply voltages to be provided in an integrated circuit (IC) chip employing the semiconductor die. However, the MTJ devices in the MRAM having higher breakdown voltages can more easily maintain the desired write operation margin to avoid or reduce the likelihood of write operations causing dielectric breakdown for increased reliability and endurance.

In certain aspect disclosed herein, breakdown voltage of MTJ devices in a memory array are lowered by introducing defects in a tunnel barrier of the MTJ. For example, the interface between the tunnel barrier and a free or pinned layer of the MTJ device can be smoothed to enhance the quality of the interface to the tunnel barrier to increase a tunnel magneto-resistance ratio (TMR), thereby increasing breakdown voltage as a result. As another example, the interface between the tunnel barrier and a free or pinned layer of the MTJ device can be roughened to decrease the quality of the interface to the tunnel barrier to decrease TMR, thereby decreasing breakdown voltage as a result. In another example, defects can be introduced in the side walls of an MTJ during its fabrication to lower its breakdown voltage. As yet another example, implantation can be introduced in the tunnel barrier of an MTJ during fabrication of the MTJ device to weaken a dielectric layer of the tunnel barrier, thus reducing the breakdown voltage as a result. The MTJ devices in memory arrays that have different breakdown voltages can be formed out of the same MTJ, with additional processes performed in an MTJ in only those areas in the semiconductor die that will form a memory array requiring its MTJ devices to have lower breakdown voltage. In this manner, the same fabrication processes can be employed to form the MTJ in the semiconductor die from which the MTJ devices will be formed, thus reducing complexity in fabrication processes.

In this regard in one aspect, a semiconductor die is provided. The semiconductor die comprises a first memory array comprising a first plurality of memory bit cells each comprising a first MTJ device. The first MTJ device comprises a first bottom electrode. The first MTJ device also comprises a first MTJ disposed above the first bottom electrode. The first MTJ comprises a first pinned layer having a first pinned layer magnetic moment, a first free layer having a first free layer magnetic moment, and a first tunnel barrier disposed between the first pinned layer and the first free layer, wherein the first MTJ has a first breakdown voltage. The semiconductor die also comprises a second memory array comprising a second plurality of memory bit cells each comprising a second MTJ device. The second MTJ device comprises a second bottom electrode. The second MTJ device also comprises a second MTJ disposed above the second bottom electrode. The second MTJ comprises a second pinned layer having a second pinned layer magnetic moment, a second free layer having a second free layer magnetic moment, and a second tunnel barrier disposed between the second pinned layer and the second free layer, wherein the second MTJ stack has a second breakdown voltage less than the first breakdown voltage.

In another aspect, a method of fabricating memory bit cells in a semiconductor die is provided. The method comprises forming a first MTJ device in a first memory array. Forming the first MTJ device in the first memory array comprises forming a first bottom electrode from a first bottom electrode material, and forming a first MTJ above the first bottom electrode. The first MTJ comprises a first pinned layer, a first free layer, and a first tunnel barrier material formed between the first pinned layer and the first free layer. The method also comprises forming a second MTJ device in a second memory array. Forming the second MTJ device in the second memory array comprises forming a second bottom electrode from a second bottom electrode material and forming a second MTJ above the second bottom electrode. The second MTJ comprises a second pinned layer, a second free layer, and a second tunnel barrier material formed between the second pinned layer and the second free layer. The method also comprises causing a defect to be formed in the second tunnel barrier material such that a second breakdown voltage of the second MTJ is less than a first breakdown voltage of the first MTJ.

DETAILED DESCRIPTION

Figure 1:
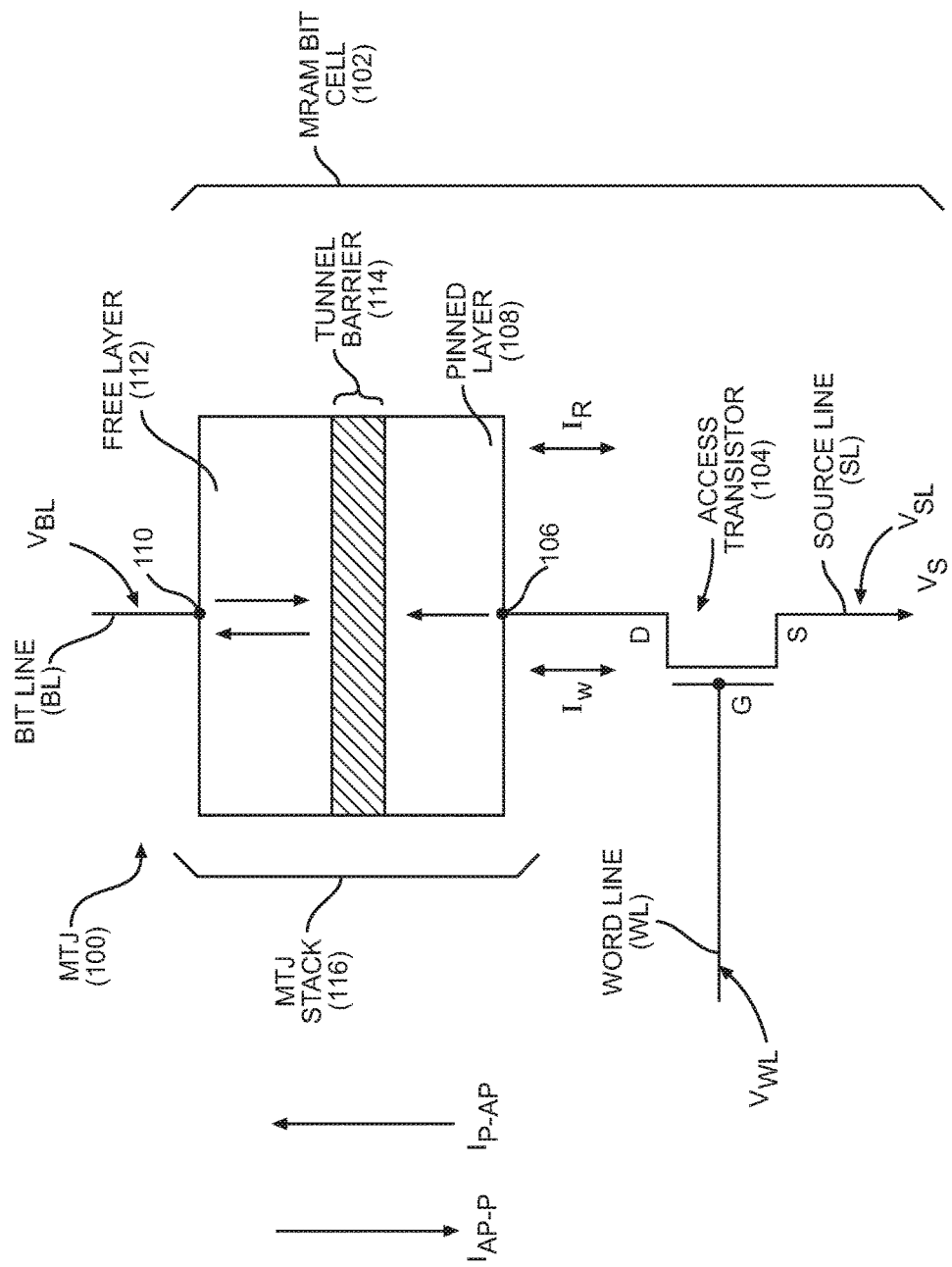
FIG. 1 is a schematic diagram of an exemplary magneto-resistive random access memory (MRAM) bit cell that employs a magnetic tunnel barrier (MTJ) to store a memory state based on a magnetization state of a free magnetization layer, wherein a plurality of the MRAM bit cells can be provided in an MRAM array in an integrated circuit (IC) to form a memory array.
Figure 2:
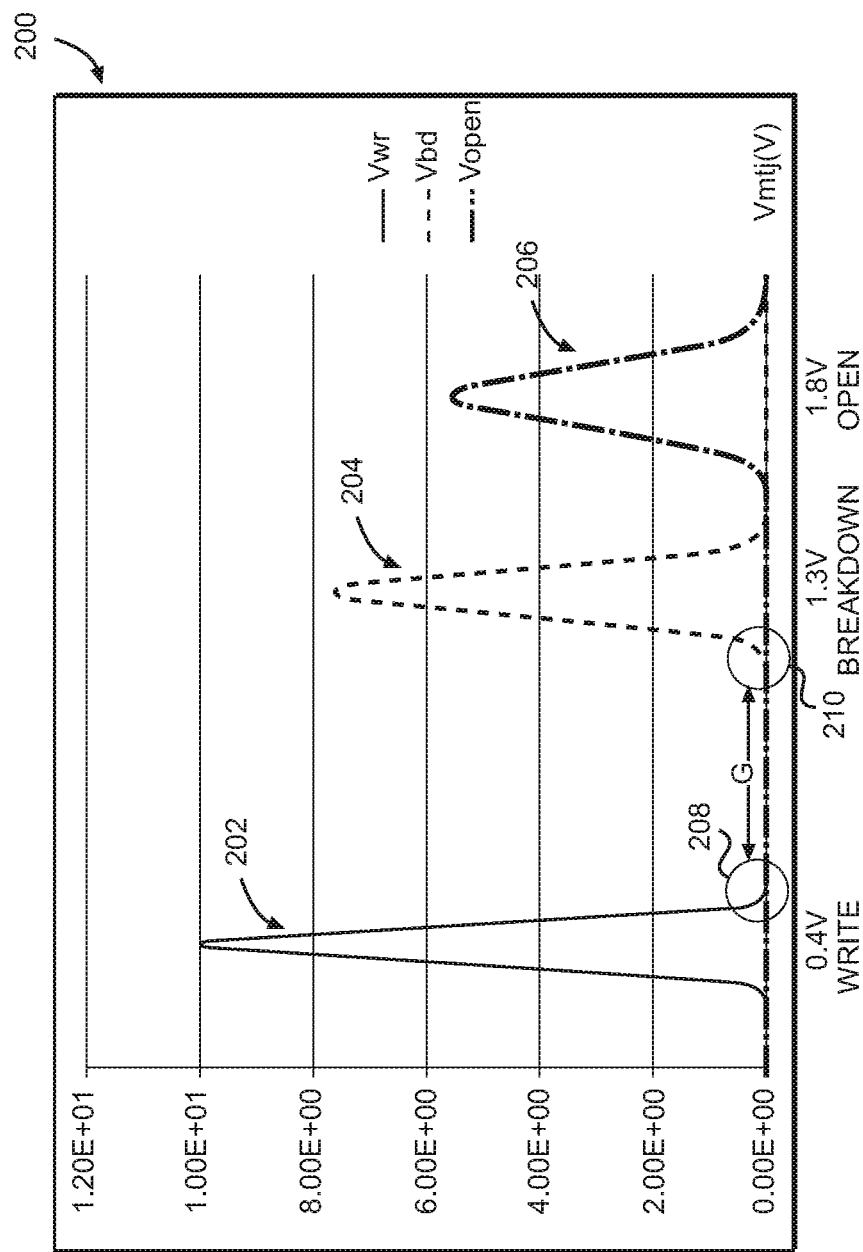
FIG. 2 is a graph illustrating exemplary write, breakdown, and open circuit voltage distributions for the MTJ in FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein magnetic tunnel junction (MTJ) devices with varied breakdown voltages in different memory arrays fabricated in a same semiconductor die to facilitate different memory applications. It can be advantageous to fabricate MTJ devices for memory applications in a semiconductor die using the same fabrication processes. However, different memories employing MTJ devices for memory bit cells may require different tradeoffs between breakdown voltage and endurance. The breakdown voltage of an MTJ is the applied voltage at which a dielectric tunnel barrier in the MTJ device is stressed such that it electrically breaks down and becomes a short circuit. Thus, in exemplary aspects disclosed herein, MTJ devices are fabricated in a semiconductor die to provide at least two different memory arrays. The MTJ devices in each memory array are fabricated to have different breakdown voltages. For example, the breakdown voltage of an MTJ device can be varied by controlling defects in a fabricated MTJ stack that are then processed to form MTJ devices. For example, it may be desired to fabricate a One-Time-Programmable (OTP) memory array using MTJ devices having a first breakdown voltage, and a separate magneto-resistive random access memory (MRAM) with MTJ devices having a higher breakdown voltage. Thus, MTJ devices in the OTP memory array having lower breakdown voltages require less voltage energy to program, which may be advantageous for example to allow for lower supply voltages to be provided in an integrated circuit (IC) chip employing the semiconductor die. However, the MTJ devices in the MRAM having higher breakdown voltages can more easily maintain the desired write operation margin to avoid or reduce the likelihood of write operations causing dielectric breakdown for increased reliability and endurance.

In certain aspects disclosed herein, breakdown voltage of MTJ devices in a memory array are lowered by introducing defects in a tunnel barrier of the MTJ. For example, the interface between the tunnel barrier and a free or pinned layer of the MTJ device can be smoothed to enhance the quality of the interface to the tunnel barrier to increase a tunnel magneto-resistance ratio (TMR), thereby increasing breakdown voltage as a result. As another example, the interface between the tunnel barrier and a free or pinned layer of the MTJ device can be roughened to decrease the quality of the interface to the tunnel barrier to decrease TMR, thereby decreasing breakdown voltage as a result. In another example, defects can be introduced in the side walls of an MTJ during its fabrication to lower its breakdown voltage. As yet another example, implantation can be introduced in the tunnel barrier of an MTJ during fabrication of the MTJ device to weaken a dielectric layer of the tunnel barrier, thus reducing the breakdown voltage as a result. The MTJ devices in memory arrays that have different breakdown voltages can be formed out of the same MTJ, with additional processes performed in an MTJ in only those areas in the semiconductor die that will form a memory array requiring its MTJ devices to have lower breakdown voltage. In this manner, the same fabrication processes can be employed to form the MTJ in the semiconductor die from which the MTJ devices will be formed, thus reducing complexity in fabrication processes.

Figure 3:
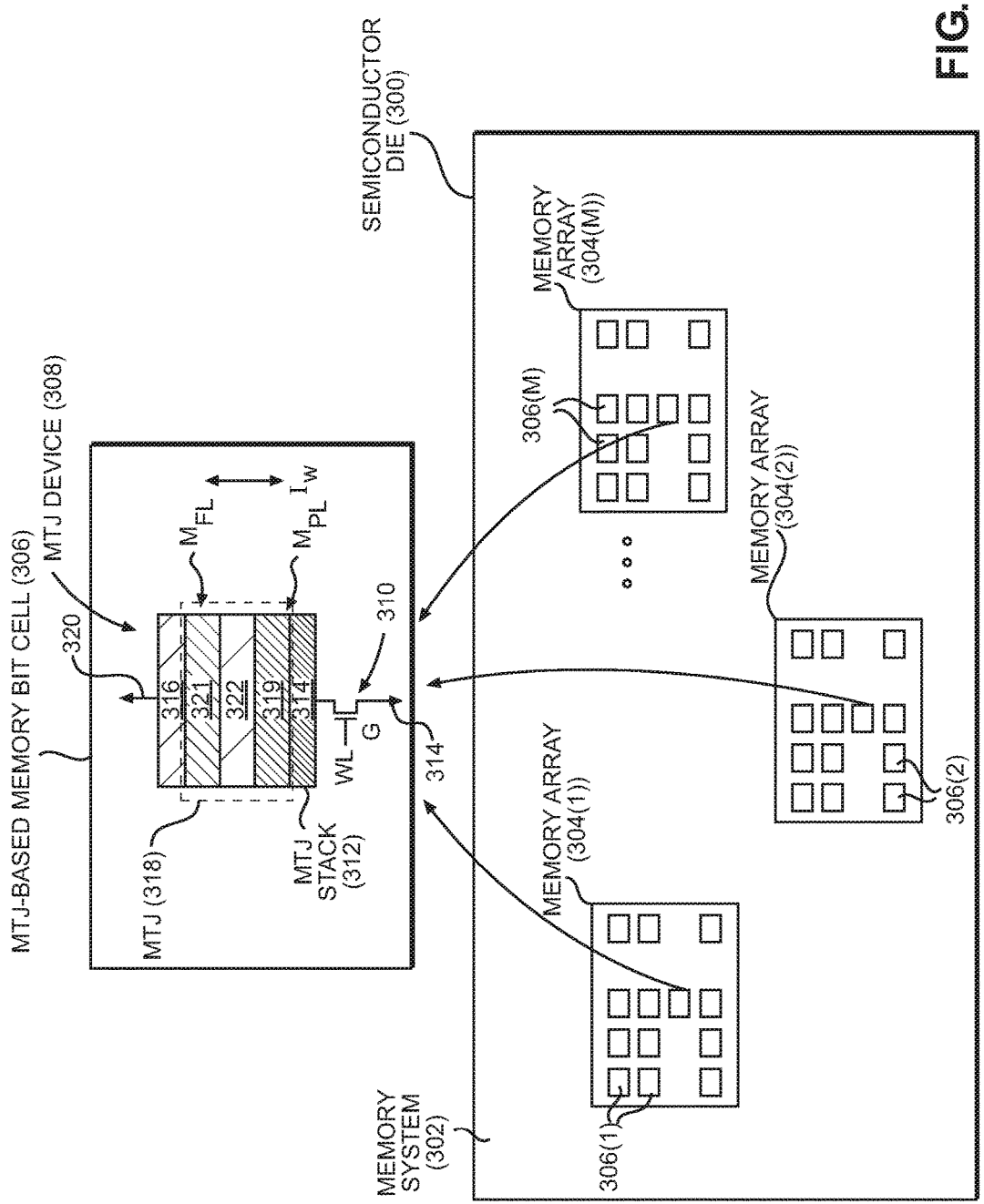
FIG. 3 is schematic diagram of an exemplary semiconductor die having multiple exemplary memory arrays each having memory bit cells that include MTJ devices, wherein the MTJ devices in the memory bit cells of at least two memory arrays have different breakdown voltages.

In this regard, FIG. 3 is schematic diagram of an exemplary semiconductor die 300. The semiconductor die 300 includes a memory system 302 that includes multiple memory arrays 304(1)-304(M) each including respective MTJ-based memory bit cells 306(1)-306(M) that each include an MTJ device 308 that is capable of storing a memory state, also referred to as data. The memory arrays 304(1)-304(M) may serve different purposes. For example, one memory array 304(1)-304(M) may serve a central processing unit (CPU) to allow a processor(s) therein to store data in a memory array 304(1)-304(M). As another example, another memory array 304(1)-304(M) may serve as an input/output (I/O) memory, such as a buffer memory, to store and/or buffer transferred data between the CPU and an I/O device(s). The CPU and I/O device(s) may also be fabricated in the semiconductor die 300 or may be fabricated in a different semiconductor die that is either packaged together with the semiconductor die 300 or separate from the semiconductor die 300. As shown in FIG. 3, each MTJ-based memory bit cell 306 includes the MTJ device 308 and an access transistor 310 coupled to the MTJ device 308. The access transistor 310 controls access to the MTJ device 308 by controlling the coupling of the MTJ device 308 to a voltage node which is a bottom electrode 314 to the MTJ device 308 to allow current to flow through the MTJ device 308. A gate G of the access transistor 310 is coupled to a word line WL that is configured to carry a voltage signal to control the gate-to-source voltage applied to the access transistor 310 to control activation of the access transistor 310.

As further shown in FIG. 3, the MTJ device 308 is fabricated from various material layers. The MTJ device 308 in this example includes a bottom electrode 314, a top electrode 316, and an MTJ 318 disposed therebetween and coupled to the bottom electrode 314 and the top electrode 316. The bottom electrode 314 is coupled to the access transistor 310. The top electrode 316 is coupled to another voltage node 320. Thus, current can flow through the MTJ 318 when a voltage differential is applied between the bottom electrode 314 and the access transistor 310 activated to create a current path between the bottom electrode 314 through the MTJ 318. The MTJ 318 is in this example includes a pinned magnetization layer 319 ("pinned layer 319"), a free magnetization layer 321 ("free layer 321"), and a tunnel barrier 322. The pinned layer 319 and free layer 321 are formed from a ferromagnetic material that has a magnetic moment. The MTJ 318 is fabricated such that a magnetic moment $M_{PL}$ of the pinned layer 319 is in a fixed, pinned direction, whereas a magnetic moment $M_{FL}$ of the free layer 321 can be changed. The tunnel barrier 322 is a dielectric material, such as Magnesium Oxide (MgO) for example. A sufficient write current $I_W$ flowing through the MTJ 318 can tunnel through the tunnel barrier 322 to change the magnetic orientation for the free layer 321 to represent a stored memory state. For example, the magnetic orientation of the pinned layer 319 and free layer 321 being parallel (P) to each other can represent one memory state (i.e., a logical '0' or '1'), wherein the magnetic orientation of the pinned layer 319 and free layer 321 being anti-parallel (AP) to each other can represent another memory state (i.e., logical '1' or '0').

In aspects disclosed herein, and as shown in FIG. 3, one or more MTJ devices 308 in the MTJ-based memory bit cells 306(1)-306(M) are fabricated to have varied breakdown voltages within different memory arrays 304(1)-304(M) fabricated in the same semiconductor die 300 to facilitate different memory applications. It can be advantageous to fabricate the MTJ devices 308 for memory applications in the semiconductor die 300 using the same fabrication processes. However, different memory arrays 304(1)-304(M) employing the MTJ devices 308 for MTJ-based memory bit cells 306(1)-306(M) may require different tradeoffs between breakdown voltage and endurance. The breakdown voltage of an MTJ 318 in the MTJ device 308 is the applied voltage at which its dielectric tunnel barrier 322 is stressed such that it electrically breaks down and becomes a short circuit. Thus, in FIG. 3, the MTJ devices 308 in the memory arrays 304(1)-304(M) are fabricated in the semiconductor die 300 to provide at least two different memory array 304(1)-304(M). The MTJ devices 308 in each memory arrays 304(1)-304(M) are fabricated to have different breakdown voltages. For example, the breakdown voltage of an MTJ device 308 can be varied by controlling defects in the materials of the MTJ device 308 that are then processed in fabrication processes to form the MTJ device 308.

Figure 4:
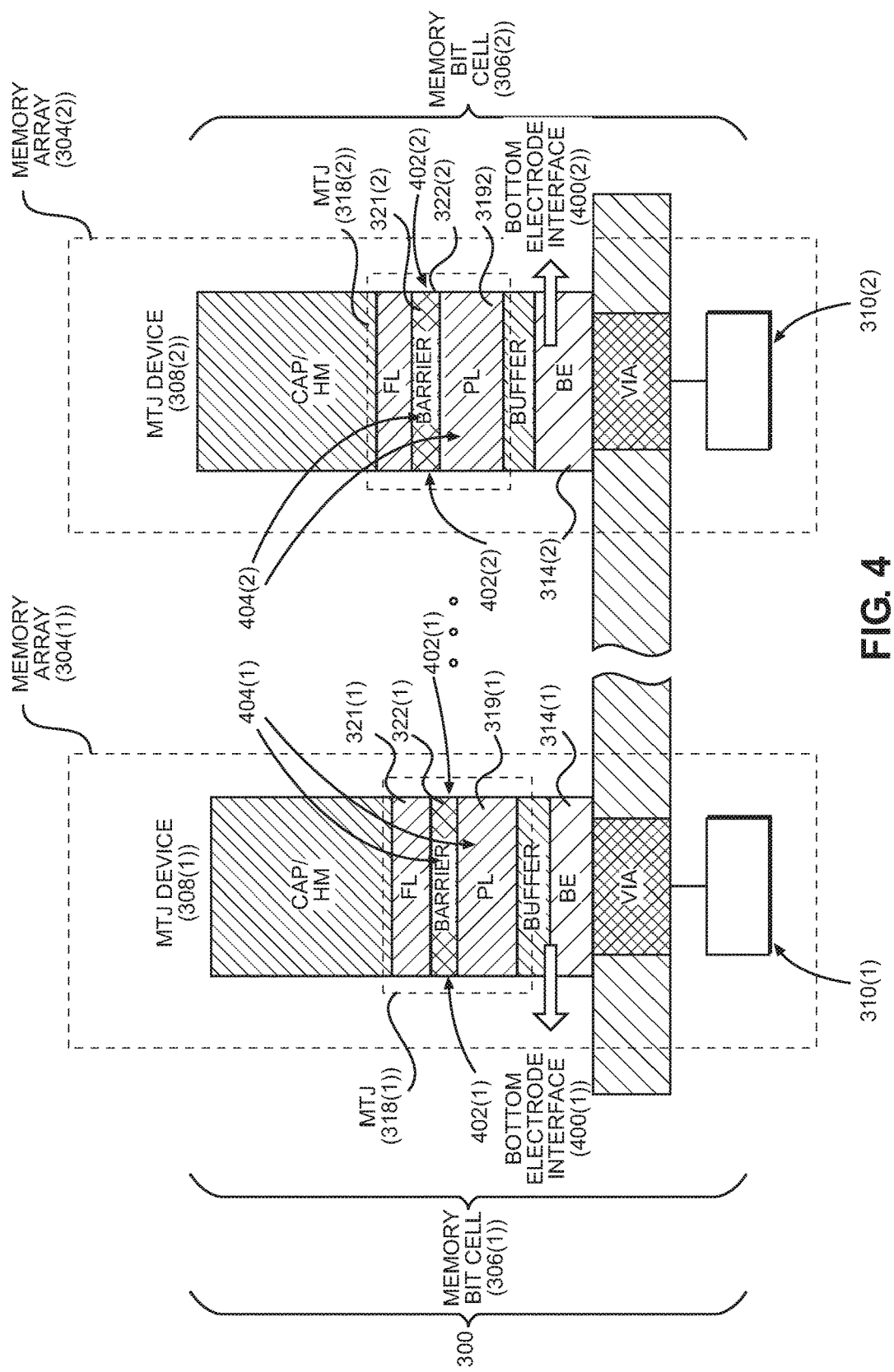
FIG. 4 is a side view diagram of two exemplary MTJ devices employed in different memory arrays in the semiconductor die in FIG. 3, wherein each MTJ device is fabricated from common material layers and wherein at least one MTJ device has an introduced defect or damage in its tunnel barrier to lower its breakdown voltage from the breakdown voltage of the other MTJ device.

For example, as shown in a side view of the semiconductor die 300 in FIG. 4, it may be desired to fabricate one of the memory arrays 304(1)-304(M) in the semiconductor die 300 as a One-Time-Programmable (OTP) memory array 304(1)-304(M) using MTJ devices 308(1) having a first breakdown voltage, and fabricate a separate magneto-resistive random access memory (MRAM) memory array 304(1)-304(M) with MTJ devices 308(2) having a higher breakdown voltage. Note that FIG. 4 only shows one MTJ-based memory bit cell 306(1), 306(2) for each of the two memory arrays 304(1), 304(2) in the semiconductor die 300. But note that each memory array 304(1), 304(2) would have a plurality of respective MTJ-based memory bit cells 306(1), 306(2). As an example, memory array 304(1) may be an OTP memory array having MTJ-based memory bit cells 306(1) with MTJ devices 308(1) having a lower breakdown voltage (e.g., 1.2 Volts (V)), and memory array 304(2) may be an MRAM memory array having MTJ-based memory bit cells 306(2) with MTJ devices 308(2) having a higher breakdown voltage (e.g., 1.6 V). Thus in this example, the MTJ devices 308(1) in the OTP memory array 304(1) having a lower breakdown voltage requires less voltage energy to program, which may be advantageous to allow for lower supply voltages to be provided in an IC chip employing the semiconductor die 300. However, the MTJ devices 308(2) in the MRAM memory array 304(1)-304(M) having higher breakdown voltages can more easily maintain the desired write operation margin to avoid or reduce the likelihood of write operations causing dielectric breakdown for increased reliability and endurance. For example, the increased endurance in the MTJ devices 308(2) in the MRAM memory array 304(1)-304(M) may allow for multiple, reliable read/write operations in the range of $10^6$ to $10^{16}$ operations. The increased breakdown voltage of the MTJ devices 308(2) may also support write operations at a lower write (i.e., switching) current.

It can be advantageous to fabricate MTJ devices 308 in different memory arrays 304(1)-304(M) in the semiconductor die 300 having varied breakdown voltages using similar processes and forming their respective MTJs 318 from the same material layers. For example, the ability to use the same or similar processes to fabricate different MTJ devices 308 in different memory arrays 304(1)-304(M) can result in a more efficient fabrication process thus increasing throughput of manufacture of the semiconductor die 300. Also, the MTJs 318 of the respective MTJ devices 308 in different memory arrays 304(1)-304(M) having varied breakdown voltages in different memory arrays 304(1)-304(M) can be fabricated having varied breakdown voltages from the same material layers. There are different examples of how the breakdown voltage of the different MTJ devices 308 in different memory arrays 304(1)-304(M) in the semiconductor die 300 in FIG. 3 can be varied to provide different types of memory applications in the different memory arrays 304(1)-304(M).

In this regard, as shown in FIG. 4, as an example, the breakdown voltage of MTJ devices 308(1) in the memory array 304(1) can be increased by introducing defects in the bottom electrodes 314(2) of the MTJ devices 308(2). In this manner, the breakdown voltage of the MTJ devices 308(2) in the memory array 304(2) can be lowered over the breakdown voltage of the MTJ devices 308(1) in memory array 304(1), if such were desired. In this example, it is desired for the MTJ devices 308(2) in the memory array 304(2) to have a higher breakdown voltage than the MTJ devices 308(1) in the memory array 304(1). For example, a bottom electrode interfaces 400(1) between the bottom electrodes 314(1) and the pinned layers 319(1) (or the free layer 321(1) if disposed on the side of the tunnel barrier 322(1) closest to the bottom electrodes 314(1) of the MTJ device 308(1)) could be smoothed during the process of fabricating the MTJ device 308(1). For example, this has the effect of enhancing the quality of the bottom electrode interfaces 400(1) to the tunnel barriers 322(1) to increase tunnel magneto-resistance ratio (TMR) of the MTJ 318(1), thus increasing breakdown voltage of the MTJs 318(1) in the memory array 304(1) as a result as compared to the MTJs 318(2) in the memory array 304(2).

The thicker the area under the tunnel barrier 322(2), the more likely "roughness" will be present at bottom electrode interface 400(2) between the pinned layer 319(2) and the tunnel barrier 322(2) of the MTJ 318(2) as a result of higher-stacked material layers becoming uneven as the MTJ device 308(2) is fabricated from material layers. A rougher tunnel barrier interface results in areas of the tunnel barrier 322(2) that are thinner than other areas, resulting in greater current leakage across the tunnel barrier 322(2), thus reducing breakdown voltage. A surface roughness (i.e., roughness) is a component of surface texture. Roughness can be quantified by the deviations in the direction of the normal vector of a real surface from its ideal form. If these deviations are large, the surface is rough; if they are small, the surface is smooth. In surface metrology, roughness is typically considered to be the high-frequency, short-wavelength component of a measured surface. A roughness value to quantify a surface roughness can either be calculated on a profile (line) or on a surface (area). Roughness parameter and area roughness parameters can be used. For example, an amplitude parameter of root mean squared $R_q$ or $R_{rms}$ can be used to quantify a surface roughness. Surface roughness can be calculated as the root mean squared average of profile heights of a surface over an evaluation length, which can be measured by the microscopic peaks and valleys in the surface. The formula for root mean squared roughness $R_q$ is as follows:

$$R_q = \sqrt{\frac{1}{n}\sum_{i=1}^{n} y_i^2}$$

where:
n=sample length of evaluated surface; and
$y_i$=profile height function of sample length i.

For example, a bottom electrode interface 400(1) between the bottom electrodes 314(1) and the pinned layers 319(1) (or the free layer 321(1) if disposed on the side of the tunnel barrier 322(1) closest to the bottom electrodes 314(1) of the MTJ device 308(1)) could be smoothed to have a root mean squared roughness of 0.5 Angstroms (A) or less. As a non-limiting example, by smoothing the tunnel barrier interface of the MTJ 318(1) by smoothing the bottom electrode interface 400(1), the breakdown voltage of the MTJ 318(1) may be equal to or greater than 1.2 Volts (V), and may be between approximately 1.2 V and 2.0 V, whereas the breakdown voltage of the MTJ 318(2) may equal or less than 1.2 Volts (V), and may be between approximately 0.6 V and 1.2 V. For example, the first breakdown voltage of the MTJ 318(1) may be between approximately 1.4 and 1.6 Volts (V), and the second breakdown voltage of the MTJ 318(2) may be between approximately 1.0 and 1.3 V. As a non-limiting example, the ratio of the higher breakdown voltage in a MTJ 318(1) to the lower breakdown voltage of a MTJ 318(2) may be between 1.1 and 1.3.

Figure 6:
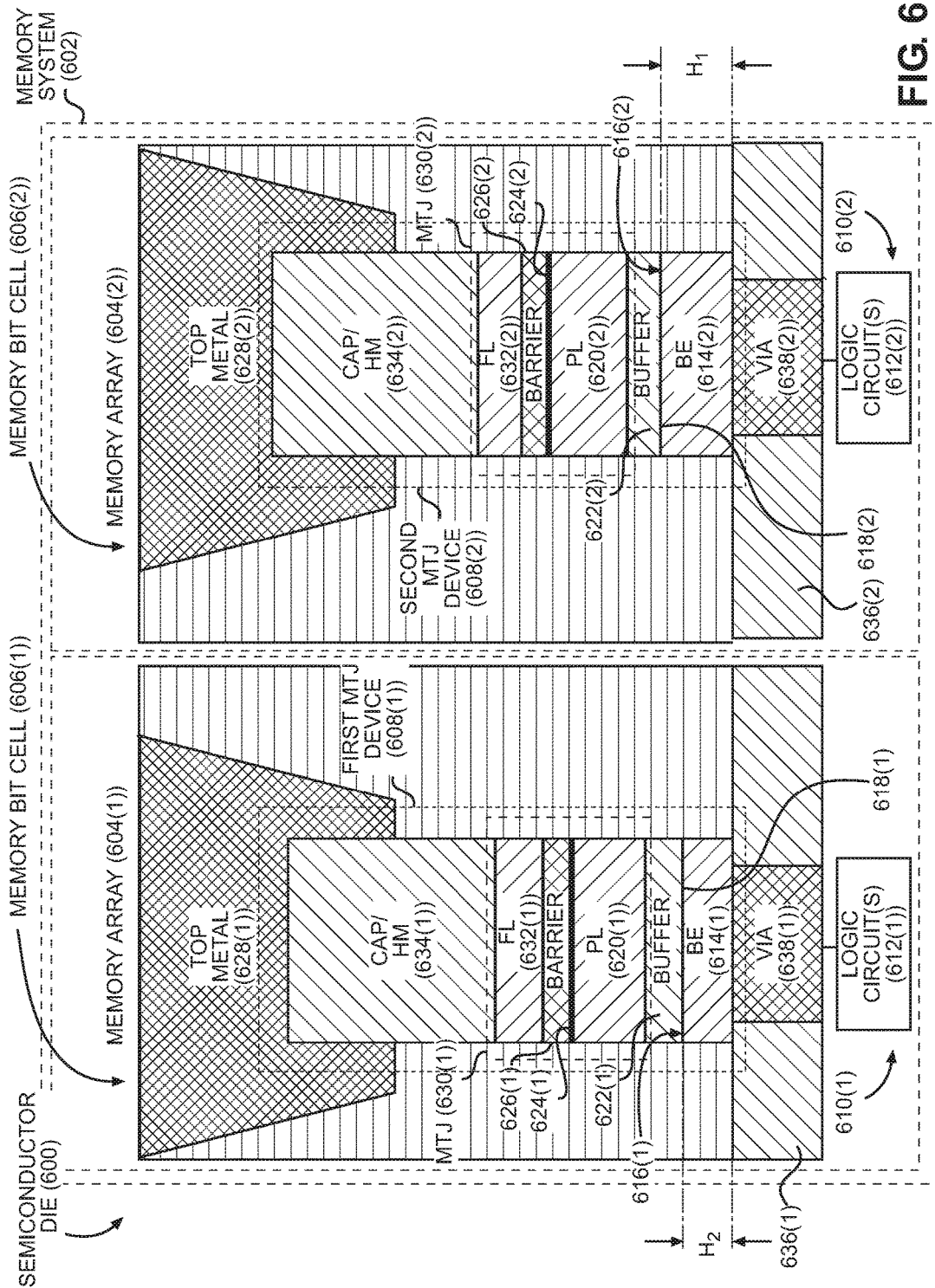
FIG. 6 is a side view of two MTJ devices in different memory arrays in a semiconductor die, wherein a bottom electrode of one MTJ device has been processed by a surface treatment to either enhance or decrease quality of the a tunnel barrier interface to either lower or increase breakdown voltage over the other MTJ device.

Thus in this example, a defect is introduced in the MTJ 318(2) in the memory array 304(2) by not smoothing the bottom electrode interfaces 400(2) of the MTJ devices 308(2), thereby leaving the bottom electrode interfaces 400(2) in rougher state than the bottom electrode interfaces 400(1) in the MTJ devices 308(1) in the memory array 304(1). An example of this process is shown in FIGS. 6-7F discussed in more detail below.

As another example, to increase breakdown voltage of the MTJ devices 308(1) in the memory array 304(1) over the breakdown voltage of the MTJ devices 308(2) in the memory array 304(2), the bottom electrode interfaces 400(2) between the bottom electrodes 314(2) and the pinned layers 319(2) (or the free layer 321(2) if disposed on the side of the tunnel barrier 322(2) closest to the bottom electrodes 314(2) of the MTJ device 308(2)) could be roughened during the process of fabricating the MTJ device 308(2). This has the effect of decreasing the quality of the bottom electrode interfaces 400(2) to the tunnel barriers 322(2) thereby decreasing the TMR of the MTJ 318(2). This has the effect of decreasing breakdown voltage of the MTJs 318(2) in memory array 304(2) as a result, as compared to the MTJs 318(1) in the memory array 304(1). Thus in this example, a defect is introduced in the MTJ 318(2) in the memory array 304(2) by increasing the roughness of the bottom electrode interfaces 400(2) of the tunnel barriers 322(2) in the MTJs 318(2). An example of this process is shown in FIGS. 6-7F discussed below.

Figure 8:
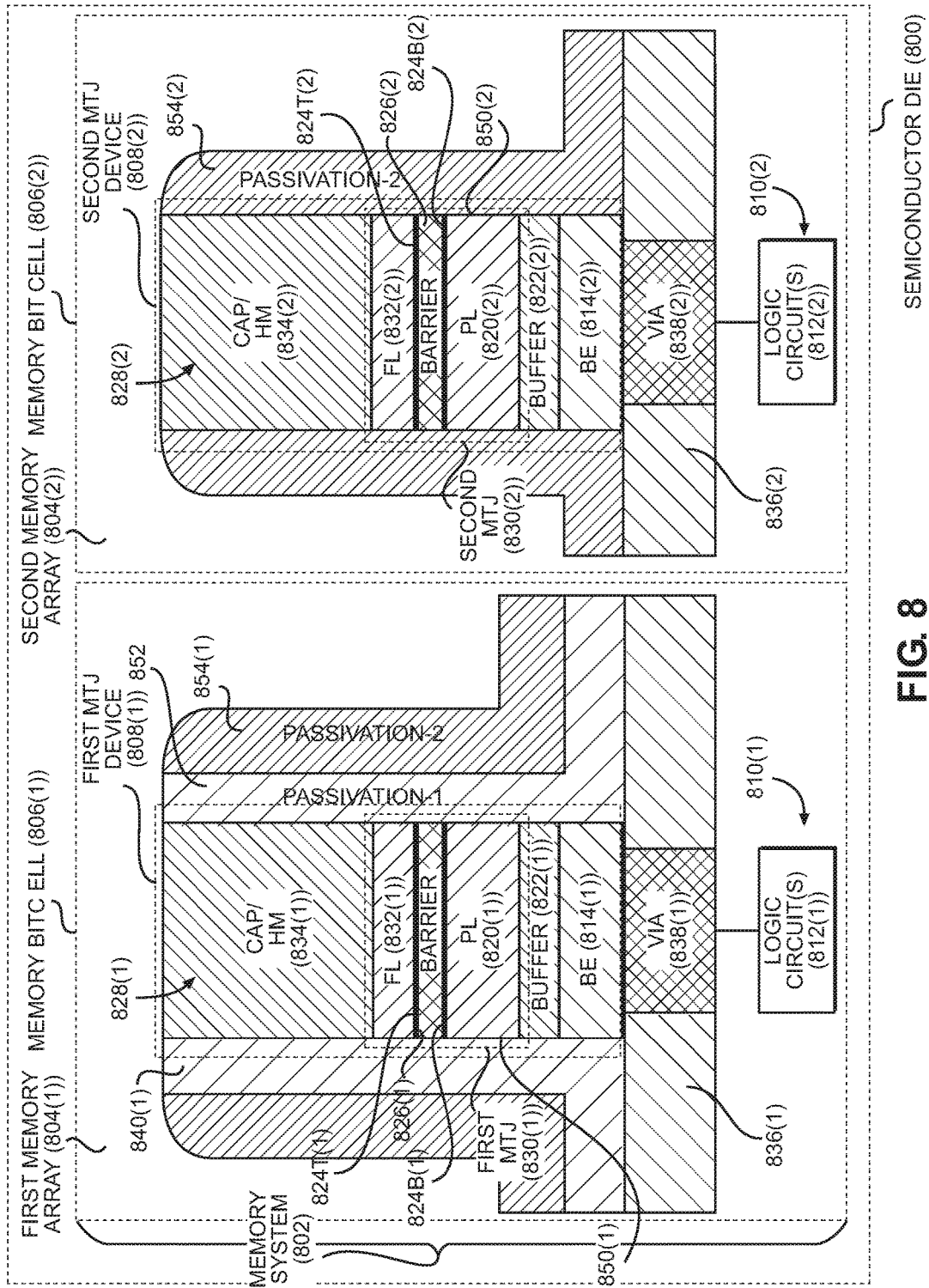
FIG. 8 is a side view of another example of two MTJ devices in different memory arrays in a semiconductor die, wherein one MTJ device has been processed to have an additional passivation layer disposed around an etched MTJ stack to allow further processing steps to introduce damage to side walls of the MTJ stack to lower breakdown voltage over the other MTJ device.

As another example, using the example of the memory arrays 304(1), 304(2) in the semiconductor die 300 shown in FIG. 4, defects can be introduced during the fabrication process in side walls 402(2) of the tunnel barriers 322(2) of the MTJs 318(2) in the memory array 304(2) to decrease the breakdown voltages of the MTJs 318(2) in memory array 304(2) over the MTJs 318(1) in memory array 304(1). For example, defects can be introduced in the side walls 402(2) of the tunnel barriers 322(2) during etching processes to form the MTJ device 308(2). Defects in the side walls 402(2) of the tunnel barriers 322(2) of the MTJs 318(2) in the memory array 304(2) decrease the quality of their bottom electrode interfaces 400(2) thereby decreasing TMR of the MTJs 318(2) as a result. Decreasing TMR of the MTJs 318(2) decreases their breakdown voltages as a result. An example of this process is shown in FIGS. 8-9F discussed in more detail below.

Figure 10:
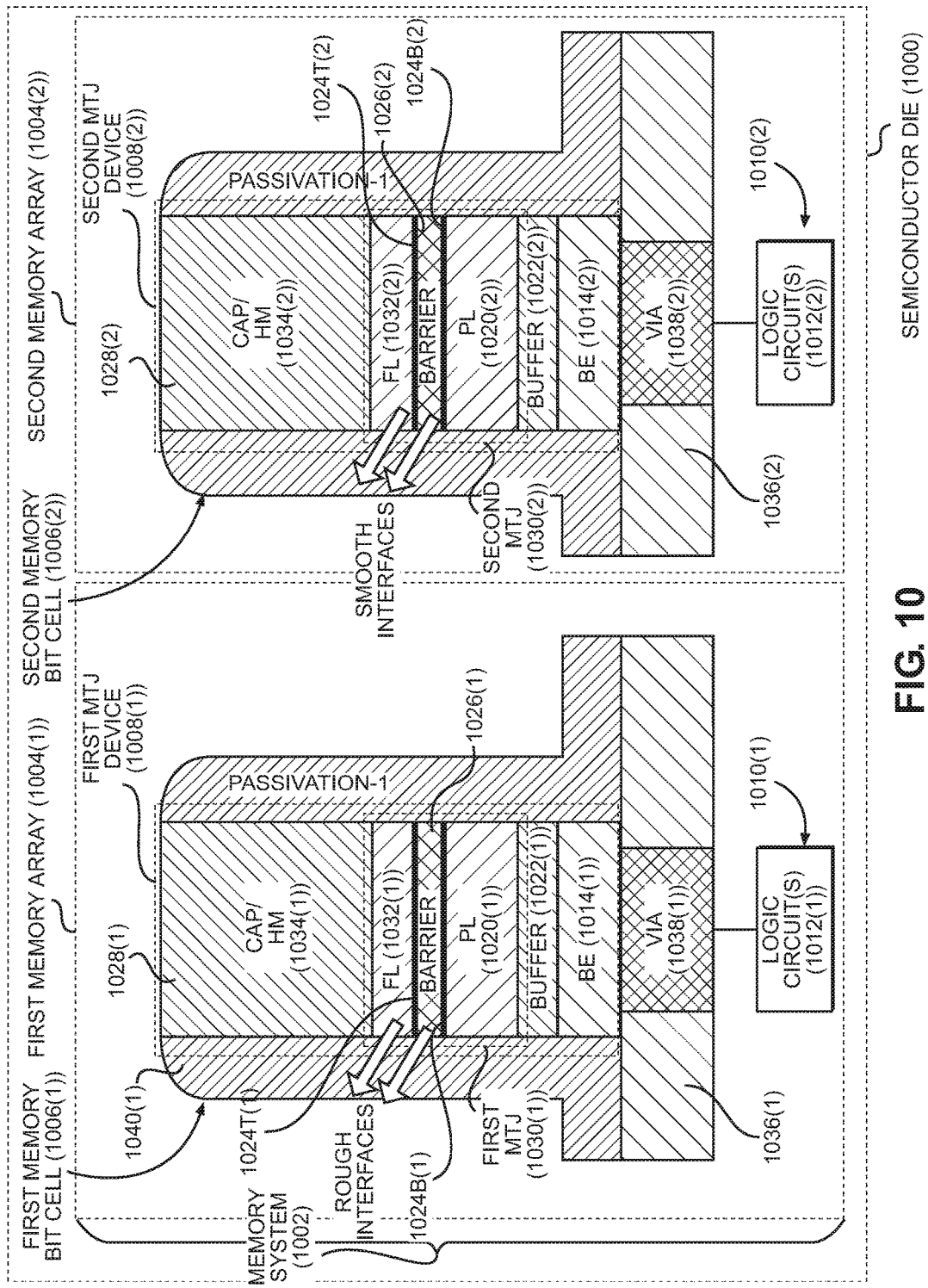
FIG. 10 is a side view of another example of two MTJ devices in different memory arrays in a semiconductor die, wherein an implantation has been introduced in a tunnel barrier of one MTJ device during fabrication to weaken a dielectric layer of the tunnel barrier, thus reducing the breakdown voltage over the other MTJ device.

As yet another example, the breakdown voltage of the MTJ devices 308(2) in the memory array 304(2) shown in FIG. 4 can be decreased by introducing defects in tunnel barriers interfaces 404(2) to the tunnel barriers 322(2) of its MTJs 318(2). In this manner, the breakdown voltage of the MTJ devices 308(2) in the memory array 304(2) would be lower than the breakdown voltage of the MTJ devices 308(1) in the memory array 304(1), if such were desired. In this example, it is desired for the MTJ devices 308(2) in the memory array 304(2) to have a lower breakdown voltage than the MTJ devices 308(1) in the memory array 304(1). An implantation, such as an ion implantation or other diffusion, can be introduced to the tunnel barrier interfaces 404(2) to the tunnel barriers 322(2) in the MTJ 318(2) during its fabrication. For example, the introduction of such an implantation can have the effect of increasing the roughness of the tunnel barriers interfaces 404(2) to the tunnel barriers 322(2), thereby decreasing TMR of the MTJs 318(2). Decreasing TMR of the MTJs 318(2) has the effect of reducing the breakdown voltage of the MTJs 318(2) in the memory array 304(2) over the breakdown voltage of the MTJs 318(1) in memory array 304(1) if an implantation is not introduced in their tunnel barrier interfaces 404(1). An example of this process is shown in FIGS. 10-11F discussed in more detail below.

Figure 5:
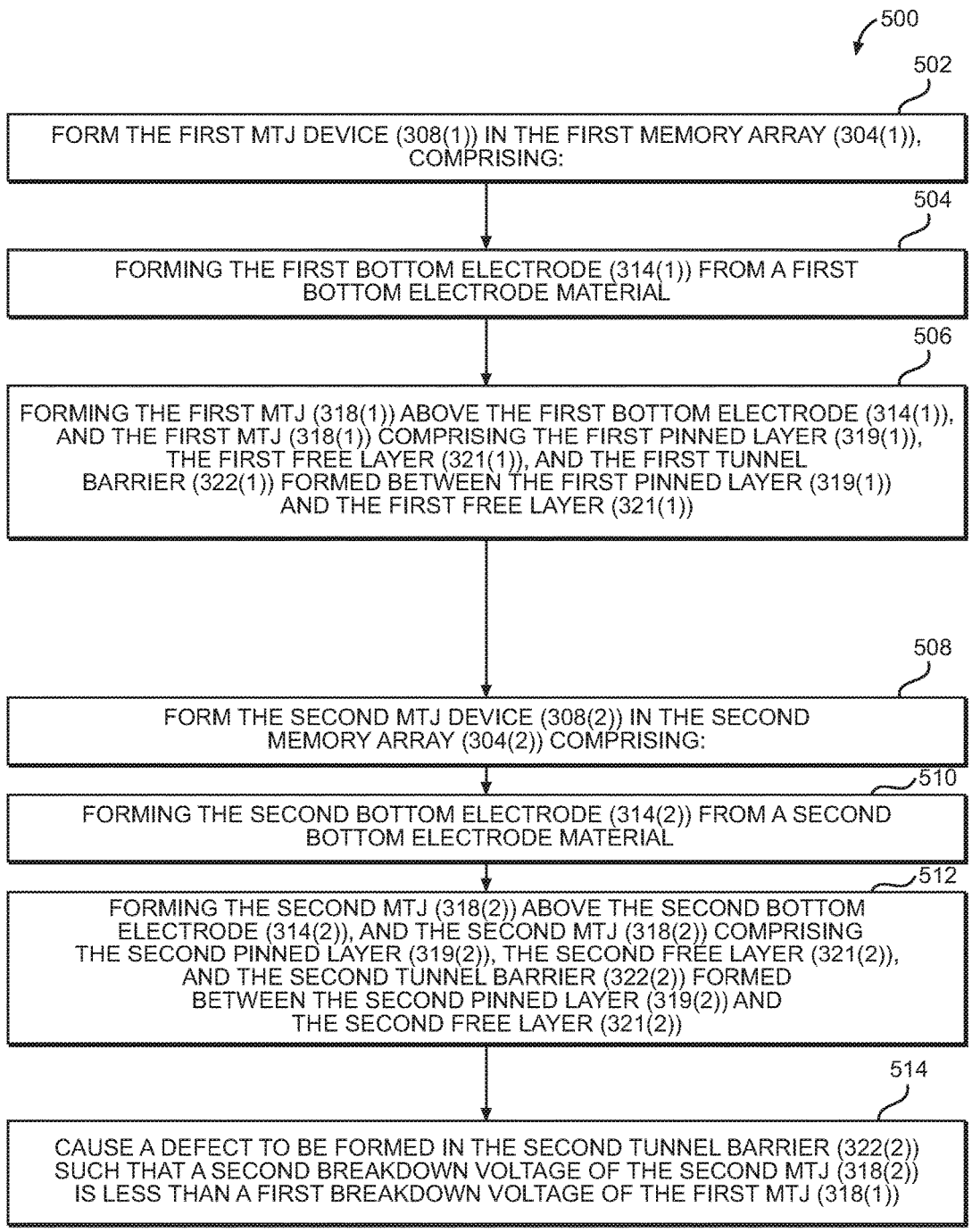
FIG. 5 is a flowchart illustrating an exemplary process of fabricating MTJ devices in different memory arrays in the semiconductor die in FIG. 3 from common MTJ stack layers and performing an additional process step(s) on at least one MTJ device to introduce a defect or damage in its tunnel barrier to lower its breakdown voltage.

FIG. 5 is a flowchart illustrating an exemplary process 500 of fabricating the MTJ devices 308(1), 308(2) having varied breakdown voltages in the first and second memory arrays 304(1), 304(2) in the same semiconductor die 300 in FIGS. 3 and 4. The process 500 also includes performing an additional process step(s) on at least one of the first and second MTJ devices 308(1), 308(2) in at least one of the memory arrays 304(1), 304(2) to introduce a defect or damage in at least one of the bottom electrode interfaces 400(1), 400(2) to lower breakdown voltage of such first and/or second MTJ devices 308(1), 308(2). The process 500 comprises forming the first MTJ device 308(1) in the first memory array 304(1) (block 502). This step comprises forming the first bottom electrode 314(1) from a first bottom electrode material (block 504). This step comprises forming the first MTJ 318(1) above the first bottom electrode 314(1), and the first MTJ 318(1) comprising the first pinned layer 319(1), the first free layer 321(1), and the first tunnel barrier 322(1) formed between the first pinned layer 319(1) and the first free layer 321(1) (block 506). The process 500 also comprises forming the second MTJ device 308(2) in the second memory array 304(2) (block 508). This step comprises forming the second bottom electrode 314(2) from a second bottom electrode material (block 510). This step comprises forming the second MTJ 318(2) above the second bottom electrode 314(2), and the second MTJ 318(2) comprising the second pinned layer 319(2), the second free layer 321(2), and the second tunnel barrier 322(2) formed between the second pinned layer 319(2) and the second free layer 321(2) (block 512). The process 500 also includes performing at least one fabrication step to cause a defect to be formed in the second tunnel barrier 322(2) such that the second breakdown voltage of the second MTJ 318(2) is less than the first breakdown voltage of the first MTJ 318(1) (block 514).

Examples of fabricating MTJ devices having varied breakdown voltages in the first and second memory arrays in a same semiconductor die will now be discussed. FIG. 6 is a side view of an exemplary semiconductor die 600 that includes a memory system 602 that includes different first and second memory arrays 604(1), 604(2) each having respective first and second memory bit cells 606(1), 606(2) with varied breakdown voltages in different memory arrays 604(1), 604(2) fabricated in the same semiconductor die 600 to facilitate different memory applications. Each memory bit cell 606(1), 606(2) includes a respective first and second MTJ device 608(1), 608(2) and a first and second access transistor 610(1), 610(2) provided in a logic circuit 612(1), 612(2). Note that although only two memory bit cells 606(1), 606(2) are shown in FIG. 6, each of the first and second memory arrays 604(1), 604(2) may include a plurality of respective first and second memory bit cells 606(1), 606(2). In this example of the semiconductor die 600 in FIG. 6, as will be discussed in more detail below, to vary the breakdown voltages of the first and/or second MTJ devices 608(1), 608(2) to be different so that the first and second memory bit cells 606(1), 606(2) in the first and second memory arrays 604(1), 604(2) will have different breakdown voltages for different applications, a first bottom electrode 614(1) of the first MTJ device 608(1) in the memory bit cell 606(1) is processed during fabrication. A top surface 616(1) of the first bottom electrode 614(1) is processed to either be smoothed (e.g., to 0.5 A or less) or roughened in an additional processing step, to then be smoother or rougher than a top surface 616(2) of a second bottom electrode 614(2) in the second memory array 604(2). For example, as discussed in more detail below, the additional processing step can include applying a plasma surface treatment to the first bottom electrode 614(1) to either smooth or roughen its top surface 616(1). A physical vapor deposition (PVD) or plasma-enhanced chemical vapor deposition (PECVD) process can be used to apply the plasma surface treatment to the first bottom electrode 614(1) to either smooth or roughen its top surface 616(1), as examples. This can also result in reducing the height $H_2$ of the first bottom electrode 614(1) for a reduced thickness over the height $H_1$ of the second bottom electrode 614(2) of the second MTJ device 608(2) in the second memory array 604(2). As a non-limiting example, the ratio of thickness of the first bottom electrode 614(1) indicated by height $H_2$ to the thickness of the second bottom electrode 614(2) indicated by height $H_1$ may be between 1.1 and 2.5. For example, smoothing the top surface 616(1) of the first bottom electrode 614(1) can provide an enhanced bottom electrode interface 618(1) to a pinned layer (PL) 620(1) (or its buffer layer (BUFFER) 622(1)) in the first MTJ device 608(1). This has the effect of enhancing the quality of a tunnel barrier interface 624(1) to a first tunnel barrier ("BARRIER-1") 626(1) in the first MTJ device 608(1) to increase TMR, thus increasing breakdown voltage of the first MTJ device 608(1) in the first memory array 604(1) as compared to the second MTJ device 608(2) in the second memory array 604(2). For example, the first MTJ device 608(1) having a smoother tunnel barrier interface 624(1) may have a TMR that is 120% of the TMR of the second MTJ device 608(2) having the rougher tunnel barrier interface 624(2). The ratio of the TMRs of the first MTJ device 608(1) to the second MTJ device 608(2) may be between approximately 1.0 to 1.5 for example.

As discussed above, the additional process step(s) could be performed on the first bottom electrode 614(1) to instead roughen its top surface 616(1) instead of smoothing the top surface 616(1). This has the effect of increasing the "roughness" present at the tunnel barrier interface 624(1) between the first pinned layer 620(1) and the first tunnel barrier 626(1) of the first MTJ device 608(1) because of those stacked material layers becoming uneven as the MTJ device 608(1) is fabricated up from the first bottom electrode 614(1). A rougher tunnel barrier interface 624(1) results in areas of the first tunnel barrier 626(1) being thinner than other areas resulting in greater current leakage across the first tunnel barrier 626(1). This has the effect of decreasing the quality of the tunnel barrier interface 624(1) to the first tunnel barrier 626(1) in the first MTJ device 608(1) to decrease TMR, thus decreasing the breakdown voltage of the first MTJ device 608(1) in the first memory array 604(1)

as compared to the second MTJ device 608(2) in the second memory array 604(2). For example, in this example, the second MTJ device 608(2) having a smoother tunnel barrier interface 624(2) may have a TMR that is 120% of the TMR of the first MTJ device 608(1) having the rougher tunnel barrier interface 624(1). In this example, the ratio of the TMRs of the second MTJ device 608(1) to the first MTJ device 608(2) may be between approximately 1.0 to 1.5 for example.

With continuing reference to FIG. 6, the first and second MTJ devices 608(1), 608(2) are fabricated from various material layers. The first and second MTJ devices 608(1), 608(2) in this example include the respective first and second bottom electrode 614(1), 614(2), a first and second top electrode ("TOP METAL") 628(1), 628(2), and a first and second MTJ 630(1), 603(2) disposed therebetween and coupled to the respective first and second bottom electrodes 614(1), 614(2) and the top electrodes 628(1), 628(2). The first and second bottom electrodes 614(1), 614(2) are coupled to the respective access transistors 610(1), 610(2). The first and second MTJs 630(1), 630(2) in this example include the respective first and second pinned magnetization layer ("pinned layer) 620(1), 620(2), a respective first and second free magnetization layer ("free layer") 632(1), 632(2), and the first and second respective tunnel barrier 626(1), 626(2). The first and second pinned layers 620(1), 620(2) and free layers 632(1), 632(2) are formed from a ferromagnetic material that has a magnetic moment. The first and second MTJs 630(1), 630(2) are fabricated such that the magnetic moment of the pinned layers 620(1), 620(2) are in a fixed, pinned direction, whereas the magnetic moment of the free layers 632(1), 632(2) can be changed. For example, the first and second pinned layers 620(1), 620(2) and/or the first and second free layers 632(1), 632(2) may be formed from different materials, examples of which include Cobalt (Co) and Platinum (Pt) or Cobalt (Co) and Nickel (Ni). In some aspects, the first and second pinned layers 620(1), 620(2) and/or the first and second free layers 632(1), 632(2) may be formed by perpendicular alloys such as Cobalt (Co)/Palladium (Pd), Iron (Fe)/Boron (B), Cobalt (Co)/Iron (Fe)/Nickel (Ni), Cobalt (Co)/Iron (Fe)/Boron (B), Tantalum (Ta)/Iron (Fe)/Cobalt (Co), Gadolinium (Gd)/Iron (Fe), Gadolinium (Gd)/Iron (Fe)/Cobalt (Co), Cobalt (Co)/Iron (Fe), other ternary alloys, or rare earth materials, for example.

With continuing reference to FIG. 6, the tunnel barriers 626(1), 626(2) are a dielectric material, such as Magnesium Oxide (MgO) for example. A first and second hard mask ("CAP/HM") 634(1), 634(2) are disposed above and in contact with the respective free layers 632(1), 632(2) and the top electrodes 628(1), 628(2). The first and second hard masks 634(1), 634(2) protect the MTJ devices 608(1), 608(2) during etching or other fabrication processes (e.g., ion beam etching (IBE)) to form the MTJ devices 608(1), 608(2) and its various material layers from materials disposed above interlayer dielectrics (ILD) 636(1), 636(2) that provide isolation for the logic circuits 612(1), 612(2) from upper metal layers. Vertical interconnect accesses (vias) 638(1), 638(2) can be formed in the ILDs 636(1), 636(2) to provide connections between the MTJ devices 608(1), 608(2) and the logic circuits 612(1), 612(2).

The first and second memory arrays 604(1), 604(M) employing the first and second MTJ devices 608(1), 608(2) with different breakdown voltages can be fabricated to achieve different tradeoffs between breakdown voltage and endurance for the first and second memory bit cells 606(1), 606(2). For example, it may be desired to fabricate the first memory array 604(1) in the semiconductor die 600 as an OTP memory array using first MTJ devices 608(1) having a first breakdown voltage, and fabricate a separate MRAM memory array with second MTJ devices 608(2) having a higher breakdown voltage. As an example, the memory array 604(1) may be an OTP memory array having memory bit cells 606(1) with its first MTJ devices 608(1) having a lower breakdown voltage (e.g., 1.2 V), than the MTJ devices 608(2) having a higher breakdown voltage (e.g., 1.6 V) in the second memory bit cells 606(2).

Figure 7A:
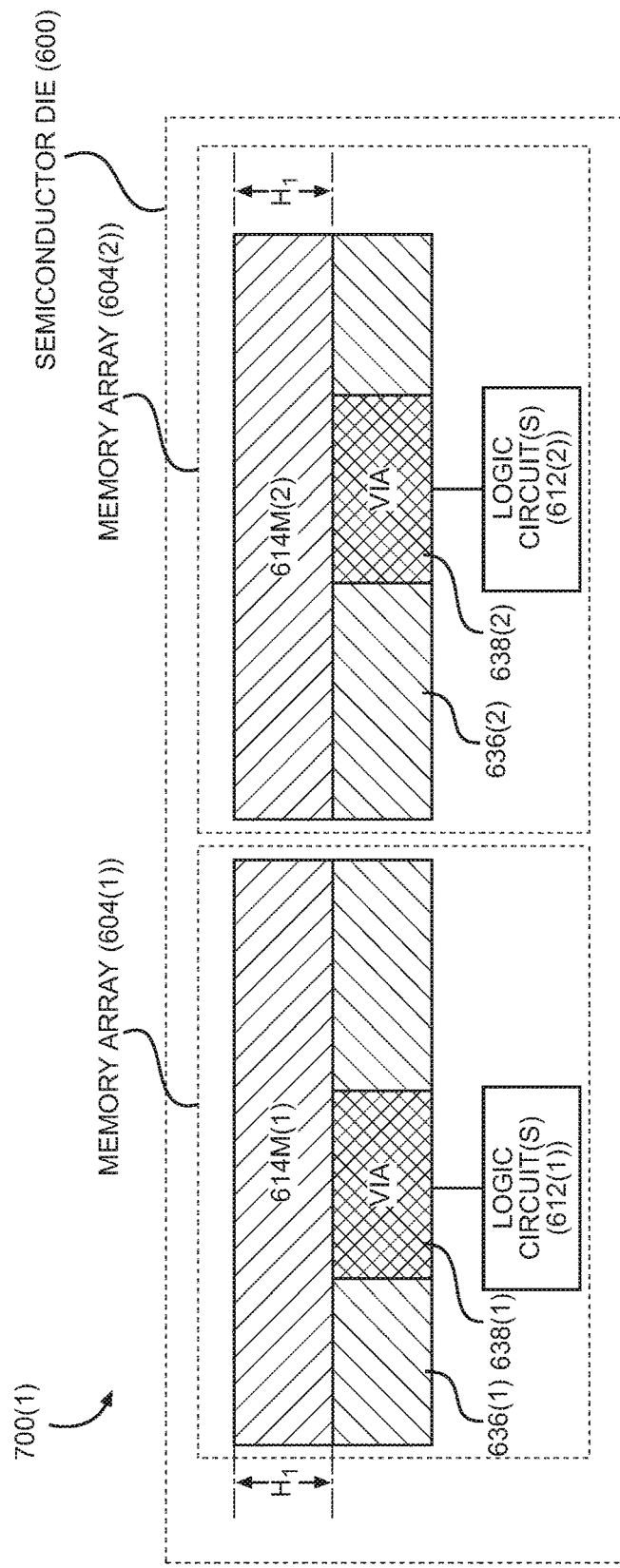
FIGS. 7A-7F illustrate side views of exemplary stages of fabricating MTJ devices in the semiconductor die in FIG. 6.
Figure 7B:
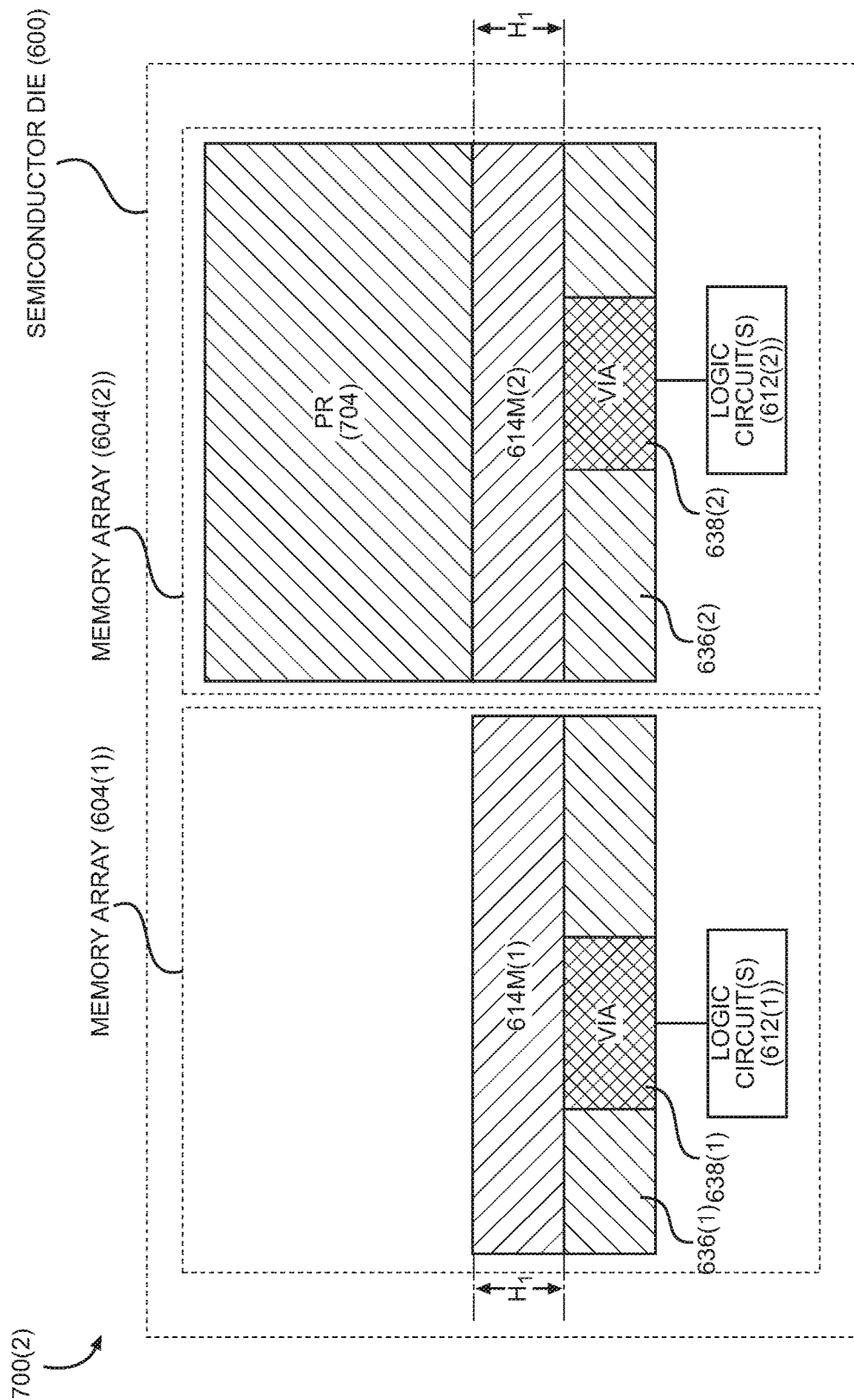
Figure 7C:
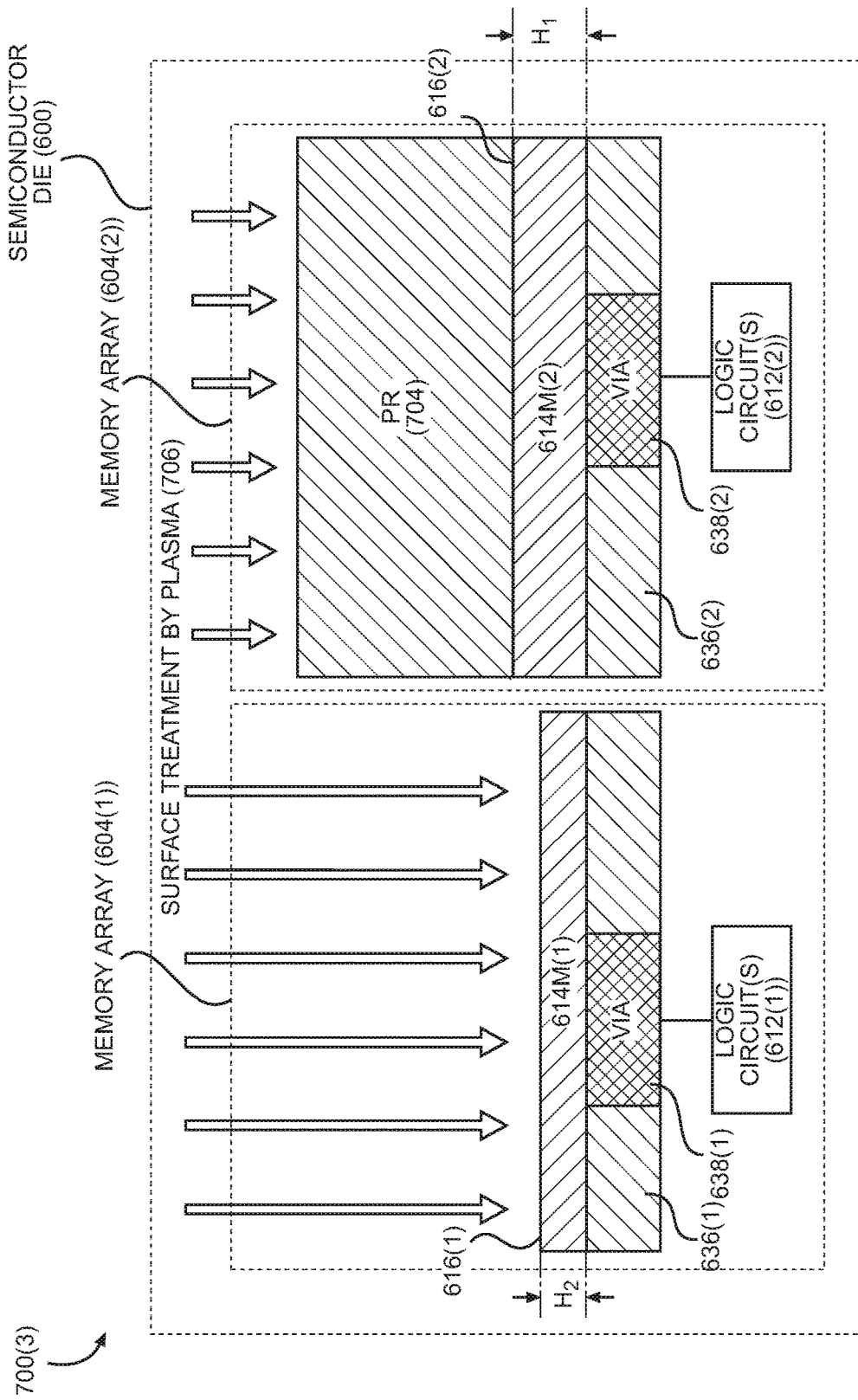
Figure 7D:
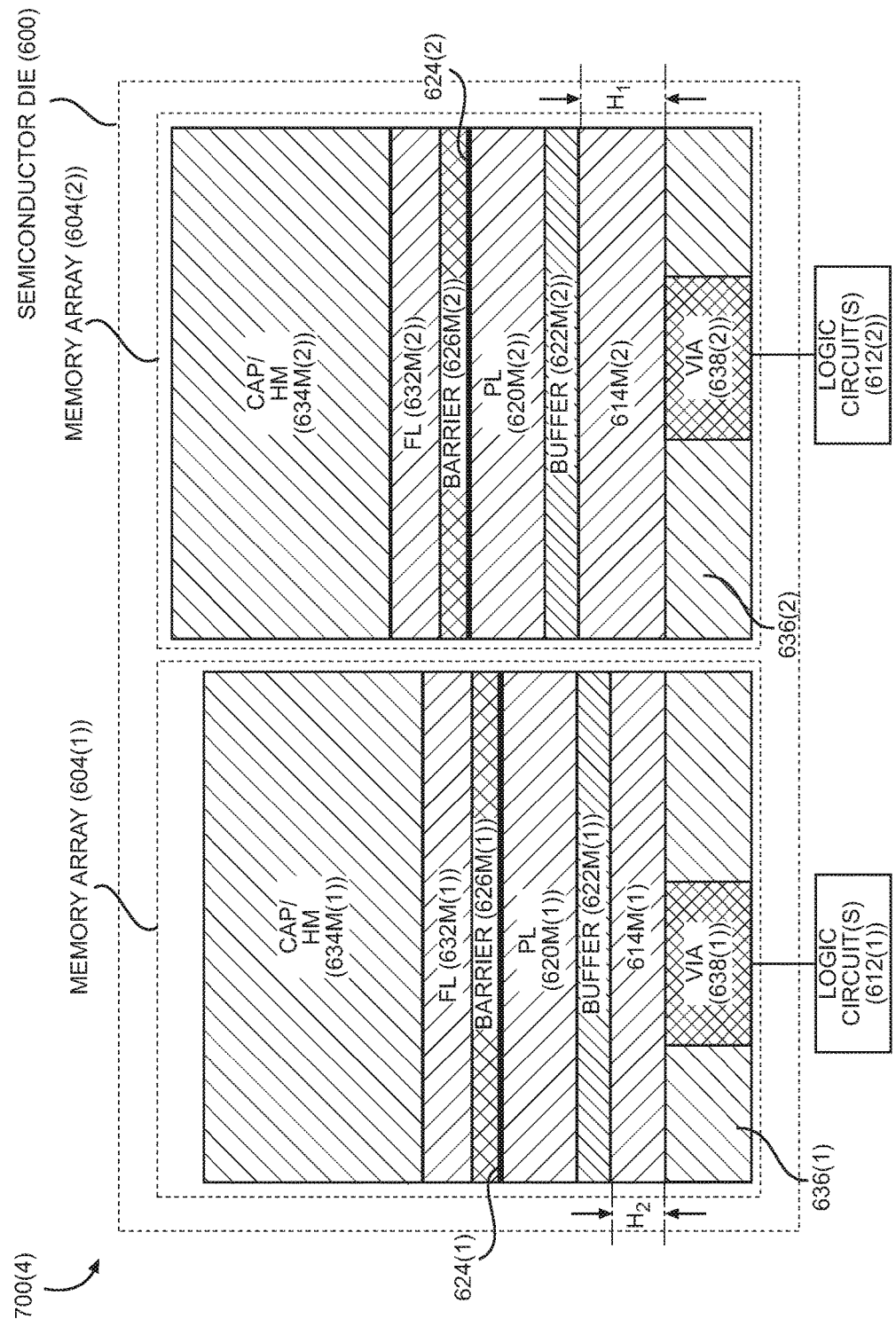
Figure 7E:
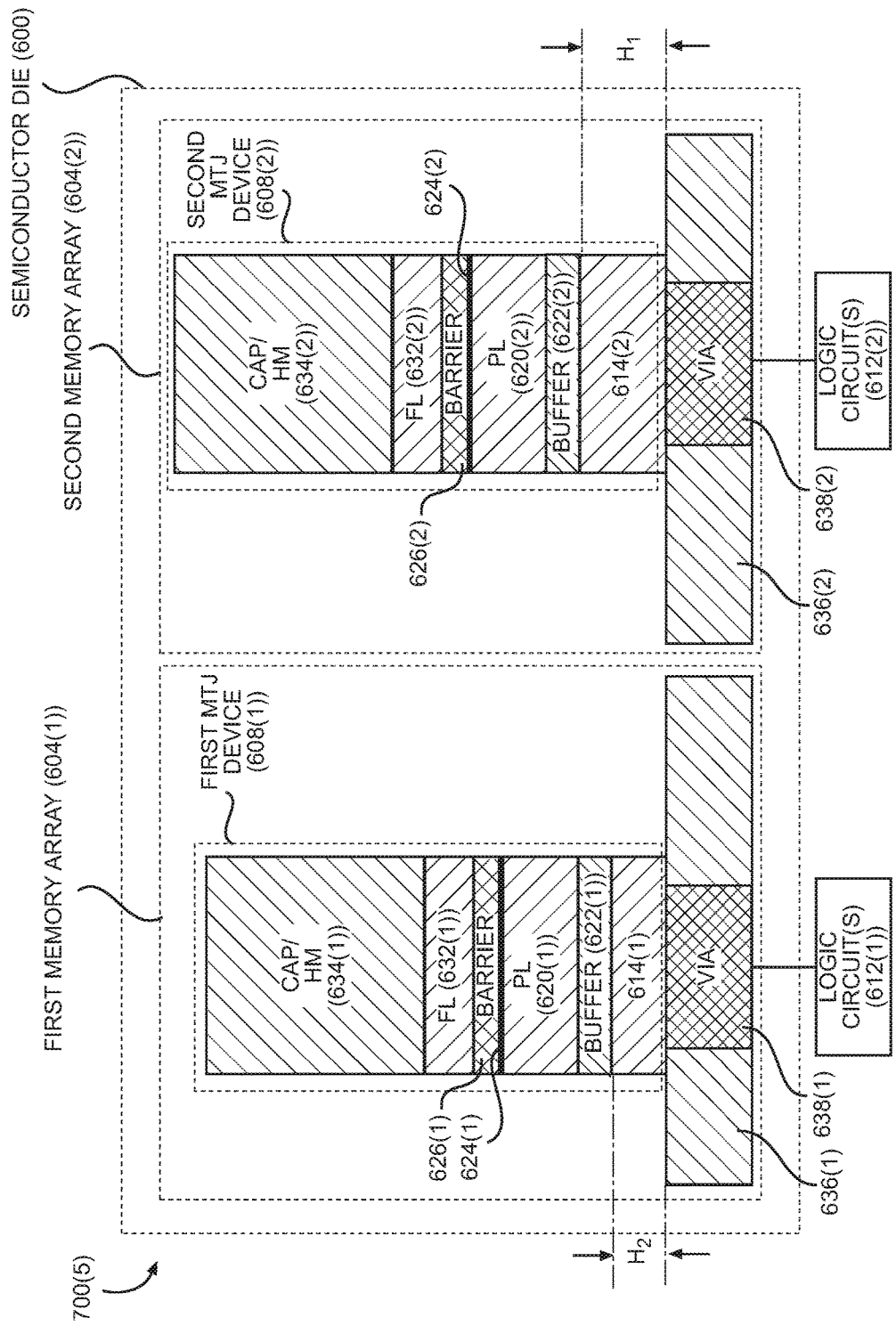
Figure 7F:
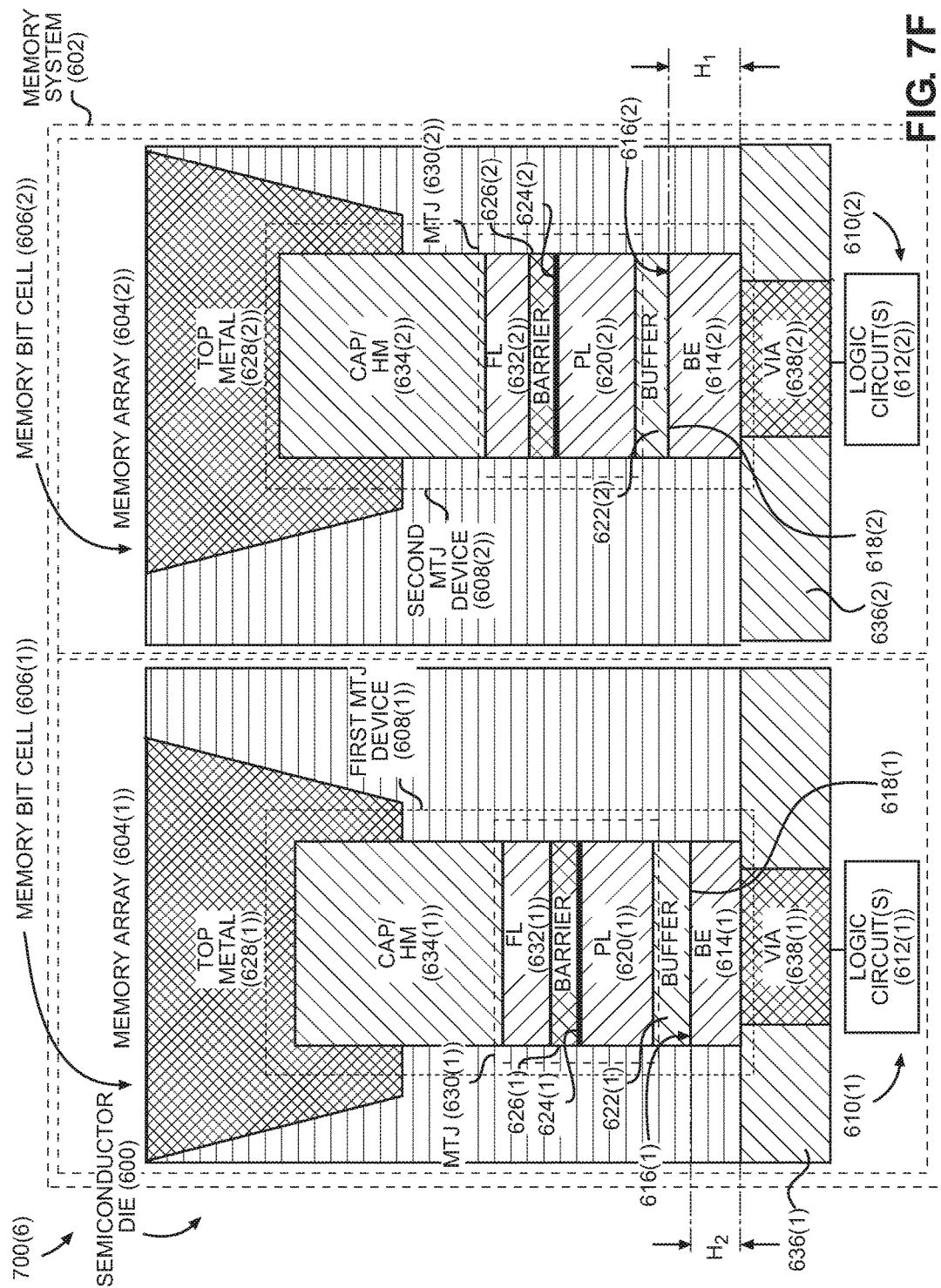

FIGS. 7A-7F illustrate side views of exemplary stages of fabricating the first and second MTJ devices 608(1), 608(2) in the memory arrays 604(1), 604(2) of the semiconductor die 600 in FIG. 6. In this regard FIG. 7A illustrates a first exemplary fabrication stage 700(1) of the semiconductor die 600 in FIG. 6. As shown therein, the first and second MTJ devices 608(1), 608(2) in the memory arrays 604(1), 604(2) of the semiconductor die 600 are formed by disposing a first and second bottom electrode material 614M(1), 614M(2) at a first thickness at height $H_1$. The first and second bottom electrode materials 614M(1), 614M(2) can be formed from any conductive material. The bottom electrodes 614(1), 614(2) in the MTJ devices 608(1), 608(2) shown in FIG. 6 will be formed from the bottom electrode materials 614M(1), 614M(2). The bottom electrode materials 614M(1), 614M(2) are formed above the ILDs 636(1), 636(2). Note that although the bottom electrode materials 614M(1), 614M(2) in FIG. 7A are shown as being adjacent to each other, the bottom electrode materials 614M(1), 614M(2) have been formed in the different memory arrays 604(1), 604(2) in different areas of the semiconductor die 600. The bottom electrode materials 614M(1), 614M(2) will be etched in later processing steps to form the MTJ devices 608(1), 608(2).

FIG. 7B illustrates an exemplary second fabrication stage 700(2) to prepare the first bottom electrode material 614M(1) to be processed after the exemplary fabrication stage 700(1) of the semiconductor die 600 in FIG. 7A. A photoresist layer (PR) 704 is disposed over the second bottom electrode material 614M(2) to protect the second bottom electrode material 614M(2). As discussed above, the first bottom electrode material 614M(1) can be processed to be roughened to affect the tunnel barrier interface 624(1) (see FIG. 6) to reduce the breakdown voltage of the first MTJ device 608(1) with its the first bottom electrode 614(1) formed from the first bottom electrode material 614M(1) (see FIG. 6). Alternatively, as also discussed above, the first bottom electrode material 614M(1) can be processed to be smoothed to provide for an enhanced tunnel barrier interface 624(1) (see FIG. 6) to increase the breakdown voltage of the first MTJ device 608(1) with its the first bottom electrode 614(1) formed from the first bottom electrode material 614M(1).

FIG. 7C illustrates an exemplary third fabrication stage 700(3) to prepare the first bottom electrode material 614M(1) to be processed after the exemplary fabrication stage 700(1) of the semiconductor die 600 in FIG. 7A. The memory arrays 604(1), 604(2) are exposed to a plasma gas 706 ("plasma 706") to provide a surface treatment to the top surface 616(1) of the first bottom electrode material 614M(1). The top surface 616(2) of the second bottom electrode material 614M(2) is not exposed to the plasma 706 because of the photoresist layer 704. In this example, the exposure of the first bottom electrode material 614M(1) to the plasma 706 decreases the thickness to height $H_2$ of the first bottom electrode material 614M(1) and roughens the first top surface 616(1), as shown in a fourth fabrication stage 700(4) in FIG. 7D. For example, the ratio between the thickness of the second bottom electrode material 614M(2) at height H₁ to the thickness of the first bottom electrode material 614M(1) at height H₂ may be between approximately 0.5 and 0.95. The exposure of the top surface 616(1) of the first bottom electrode material 614M(1) to the plasma 706 thins the first bottom electrode material 614M(1) resulting in greater current leakage across the tunnel barrier 626(1) as shown in FIG. 7D, thus reducing breakdown voltage. Roughening the top surface 616(1) of the first bottom electrode material 614M(1) can also decrease the quality of the tunnel barrier interface 624(1) to the tunnel barrier 626(1) for the first MTJ device 608(1) thereby reducing TMR and breakdown voltage as a result. Alternatively, a surface treatment could be provided to the top surface 616(1) of the first bottom electrode material 614M(1) to smooth the surface, thereby enhancing the tunnel barrier interface 624(1) to the tunnel barrier 626(2). For example, the top surface 616(1) of the first bottom electrode material 614M(1) could be planarized, such as through an etching or chemical mechanical planarization (CMP) process. Smoothing the top surface 616(1) of the first bottom electrode material 614M(1) can enhance the quality of the tunnel barrier interface 624(1) to the tunnel barrier 626(1) for the first MTJ device 608(1), thereby increasing TMR and breakdown voltage as a result.

The fourth fabrication stage 700(4) also shows the photoresist layer 704 removed and then the other material layers disposed above the first and second bottom electrode materials 614M(1), 614M(2) that will then be further processed (e.g., etched) to form the MTJ devices 608(1), 608(2). In this regard, a first and second buffer material 622M(1), 622M(2) is disposed above the first and second bottom electrode material 614M(1), 614M(2). The first and second buffer materials 622M(1), 622M(2) prepare a material interface for first and second pinned layer materials 620M(1), 620M(2) disposed above the first and second buffer material 622M(1), 622M(2) to be coupled to the first and second bottom electrode materials 614M(1), 614M(2). For example, the first and second buffer materials 622M(1), 622M(2) may be Tantalum (Ta), Tantalum Nitride (TaN), Titanium (Ti), Titanium Nitride (TiN), Ruthenium (Ru), Tungsten (W), Platinum (Pt), Palladium (Pd), Chromium (Cr), and/or Nickel Chromium (NiCR). Further, the first and second buffer materials 622M(1), 622M(2) can be a single layer or a multiple layer stack of multiple different layers of such materials, including alternating layers of such materials. The first and second pinned layer materials 620M(1), 620M(2) are ferromagnetic materials, which may be any of the materials discussed previously for the first and second pinned layers 620(1), 620(2), as the first and second pinned layers 620(1), 620(2) are formed from the first and second pinned layer materials 620M(1), 620M(2). First and second tunnel barrier material 626M(1), 626M(2) are disposed above the first and second pinned layer materials 620M(1), 620M(2). The tunnel barrier interfaces 624(1), 624(2) are formed between the first and second tunnel barrier materials 626M(1), 626M(2) and the first and second pinned layer materials 620M(1), 620M(2). The first and second tunnel barrier materials 626M(1), 626M(2) are dielectric materials, such as Magnesium Oxide (MgO) for example. First and second free layer materials 632M(1), 632M(2) are disposed above the first and second tunnel barrier materials 626M(1), 626M(2). The first and second free layer materials 632M(1), 632M(2) are ferromagnetic materials which may be any of the materials discussed previously for the first and second free layers 632(1), 632(2), as the first and second free layers 632(1), 632(2) are formed from the first and second free layer materials 632M(1), 632M(2). First and second hard mask materials 634M(1), 634M(2) are disposed over the first and second free layer materials 632M(1), 632M(2) to protect the other underlying layers during further processing, such as etching (e.g., ion beam etching (IBE)), to form the MTJ devices 608(1), 608(2).

FIG. 7E illustrates an exemplary fifth fabrication stage 700(5) after the material layers in the fourth fabrication stage 700(4) have been further processed, such as by etching, to form the first and second MTJ devices 608(1), 608(2). FIG. 7F illustrates an exemplary sixth fabrication stage 700(6) where the MTJ devices 608(1), 608(2) have been fully fabricated with first and second top electrodes 628(1), 628(2) formed above the hard masks 634(1), 634(2) and coupled to the respective MTJ devices 608(1), 608(2) as part of the first and second MTJ devices 608(1), 608(2).

FIG. 8 is a side view of another exemplary semiconductor die 800 that includes a memory system 802 that include different first and second memory arrays 804(1), 804(2) each having respective first and second memory bit cells 806(1), 806(2) with varied breakdown voltages in different memory arrays 804(1), 804(2) fabricated in the same semiconductor die 800 to facilitate different memory applications. Each memory bit cell 806(1), 806(2) includes a respective first and second MTJ device 808(1), 808(2) and first and second access transistor 810(1), 810(2) provided in a logic circuit 812(1), 812(2). Note that although only two memory bit cells 806(1), 806(2) are shown in FIG. 8, each of the first and second memory arrays 804(1), 804(2) may include a plurality of respective first and second memory bit cells 806(1), 806(2). In this example of the semiconductor die 800 in FIG. 8, as will be discussed in more detail below, to vary the breakdown voltages of the first and/or second MTJ devices 808(1), 808(2) to be different so that the first and second memory bit cells 806(1), 806(2) in the first and second memory arrays 804(1), 804(2) will have different breakdown voltages for different applications, a defect or damage is introduced in a side wall 850(1) of the MTJ device 808(1) during its fabrication to damage a tunnel barrier interface 824T(1) and/or 824B(1) of the MTJ device 808(1) to reduce the TMR of the MTJ device 808(1) and thus reduce its breakdown voltage. For example, as discussed in more detail below, an additional processing step can include a first passivation layer 852 around the MTJ device 808(1) during its fabrication that is not introduced around the MTJ device 808(2). The passivation layer 852 is selected from a material such that when the MTJ device 808(1) is etched or otherwise formed, some damage occurs to the side wall 850(1) of the MTJ device 808(1) that will not be introduced to the MTJ device 808(2). After the MTJ device 808(1) is formed, second passivation layers 854(1), 854(2) are introduced to surround the MTJ devices 808(1), 808(2), and in the case of MTJ device 808(1), the second passivation layer 854(1) surrounds the first passivation layer 852. The materials used for the second passivation layers 854(1), 854(2) are selected to be a high quality, stable, dense insulator that will provide greater protection to the side wall 850(1) of the first MTJ device 808(1) and a side wall 850(2) of the second MTJ device 808(2). Thus, the side wall 850(1) of the first MTJ device 808(1) will incur more damage than the side wall 850(2) of the second MTJ device 808(2). Damaging or introducing a defect in the side wall 850(1) of the MTJ device 808(1) to reduce the quality of the tunnel barrier interface 824T(1) and/or 824B(1) of the MTJ device 808(1) has the effect of decreasing TMR, thus decreasing breakdown voltage of the first MTJ device 808(1) in the first memory array 804(1) as compared to the second MTJ device 808(2) in the second memory array 804(2).

With continuing reference to FIG. 8, the first and second MTJ devices 808(1), 808(2) are fabricated from various material layers. The first and second MTJ devices 808(1), 808(2) in this example include a respective first and second bottom electrode 814(1), 814(2), a first and second hard masks ("CAP/HM") 834(1), 834(2), and a first and second MTJ 830(1), 830(2) disposed therebetween and coupled to the respective first and second bottom electrodes 814(1), 814(2) and the hard masks 834(1), 834(2). The first and second bottom electrodes 814(1), 814(2) are coupled to respective access transistors 810(1), 810(2). The first and second MTJs 830(1), 830(2) in this example include a respective first and second pinned magnetization layer ("pinned layer) 820(1), 820(2), a respective first and second free magnetization layer ("free layer") 832(1), 832(2), and a first and second respective tunnel barrier 826(1), 826(2). For example, the first and second pinned layer 820(1), 820(2) and/or the first and second free layers 832(1), 832(2) may be formed from may be formed from different materials, examples of which include Cobalt (Co) and Platinum (Pt) or Cobalt (Co) and Nickel (Ni). In some aspects, the first and second pinned layers 820(1), 820(2) and/or the first and second free layers 832(1), 832(2) may be formed by perpendicular alloys such as Cobalt (Co)/Palladium (Pd), Iron (Fe)/Boron (B), Cobalt (Co)/Iron (Fe)/Nickel (Ni), Cobalt (Co)/Iron (Fe)/Boron (B), Tantalum (Ta)/Iron (Fe)/Cobalt (Co), Gadolinium (Gd)/Iron (Fe), Gadolinium (Gd)/Iron (Fe)/Cobalt (Co), Cobalt (Co)/Iron (Fe), Terbium (Tb) (Tb-FeO), TbFe, TbCo, GdFeCo, GdCo, other ternary alloys, or rare earth materials, for example. The first and second pinned layers 820(1), 820(2) and free layers 832(1), 832(2) are formed from a ferromagnetic material that has a magnetic moment. The first and second MTJs 830(1), 830(2) are fabricated such that the magnetic moment of the pinned layers 820(1), 820(2) are in a fixed, pinned direction, whereas the magnetic moment of the free layers 832(1), 832(2) can be changed. The tunnel barriers 826(1), 826(2) are a dielectric material, such as Magnesium Oxide (MgO) for example. The first and second hard masks 834(1), 834(2) are disposed above and in contact with the respective free layers 832(1), 832(2) and top electrodes 828(1), 828(2). The first and second hard masks 834(1), 834(2) protect the MTJ devices 808(1), 808(2) during etching or other fabrication processes (e.g., ion beam etching (IBE)) to form the MTJ devices 808(1), 808(2) and their materials layers from materials disposed above interlayer dielectrics (ILD) 836(1), 836(2) that provide isolation for logic circuits 812(1), 812(2) from upper metal layers. Vertical interconnect accesses (vias) 838(1), 838(2) can be formed in the ILDs 836(1), 836(2) to provide connections between the MTJ devices 808(1), 808(2) and the logic circuits 812(1), 812(2).

The first and second memory arrays 804(1), 804(2) employing the first and second MTJ devices 808(1), 808(2) with different breakdown voltages can be fabricated to achieve different tradeoffs between breakdown voltage and endurance for the first and second memory bit cells 806(1), 806(2). For example, it may be desired to fabricate the first memory array 804(1) in the semiconductor die 800 as an OTP memory array using the first MTJ devices 808(1) having a first breakdown voltage, and fabricate a separate MRAM memory array with the second MTJ devices 808(2) having a higher breakdown voltage. As an example, the memory array 804(1) may be an OTP memory array having memory bit cells 806(1) with its first MTJ devices 808(1) having a lower breakdown voltage (e.g., 1.2 V), than the MTJ devices 808(2) having a higher breakdown voltage (e.g., 1.6 V) in the second memory bit cells 806(2).

Figure 9A:
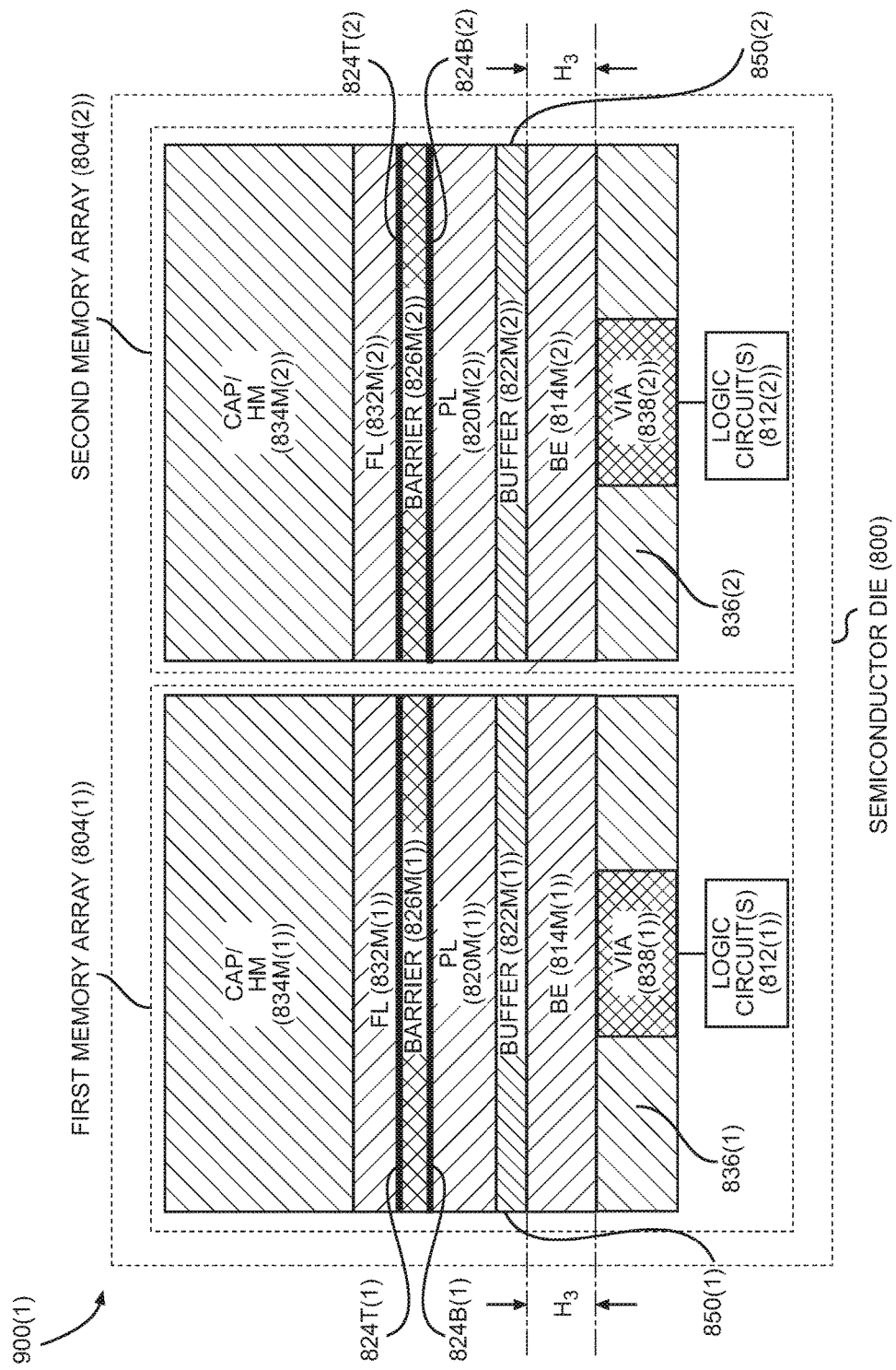
FIGS. 9A-9F illustrate side views of exemplary stages of fabricating the MTJ devices in the semiconductor die in FIG. 8.
Figure 9B:
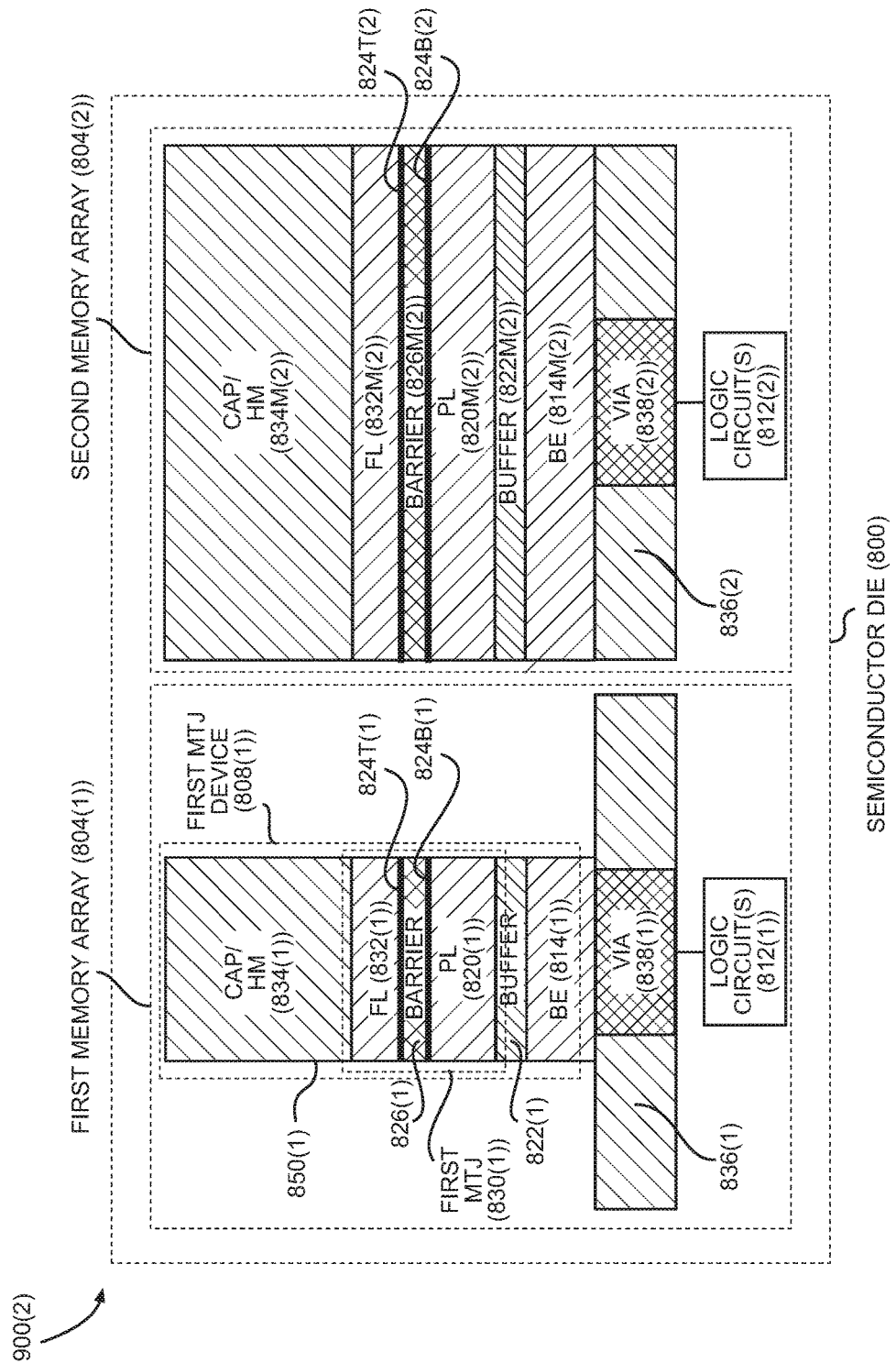
Figure 9C:
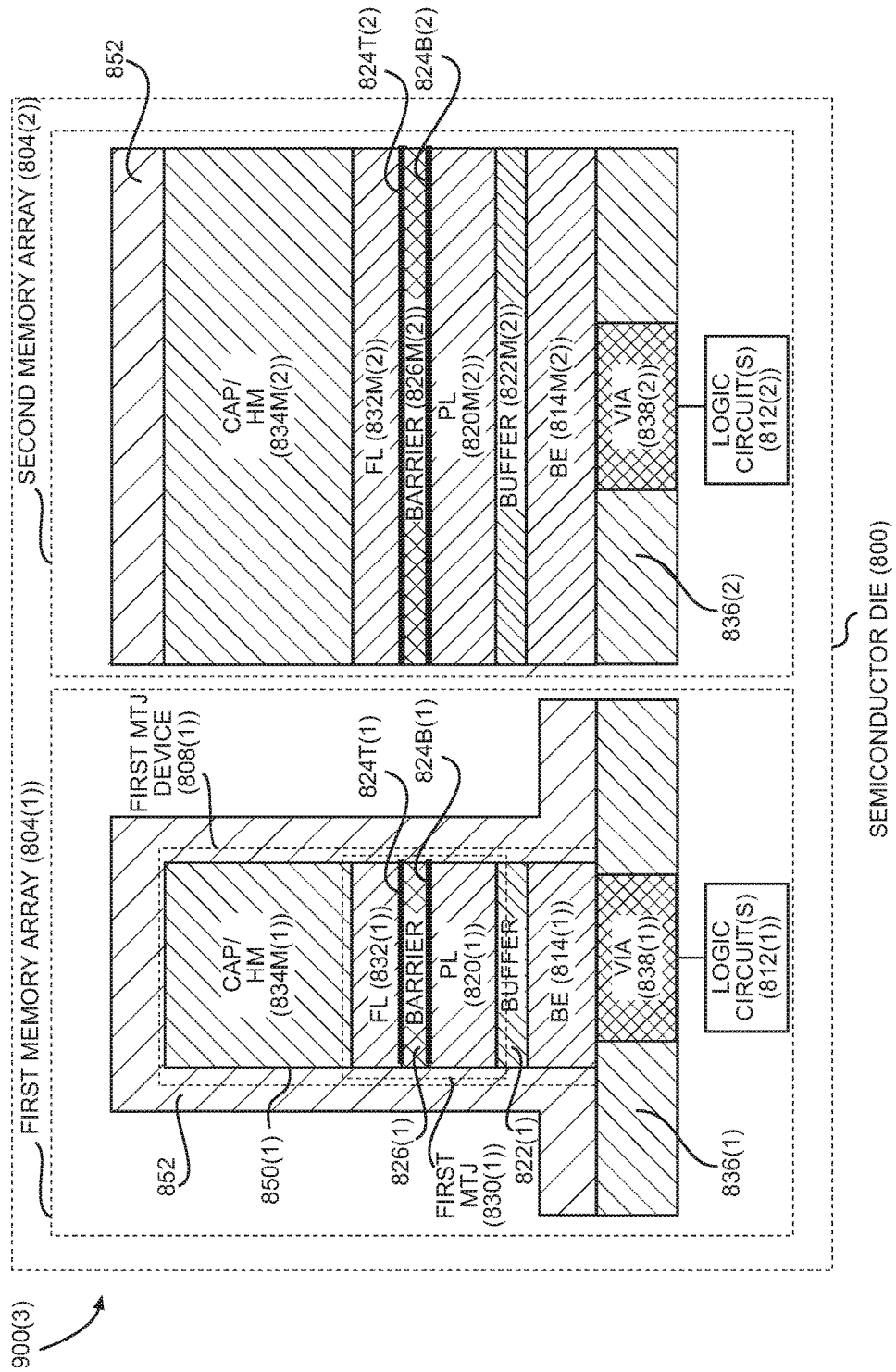
Figure 9D:
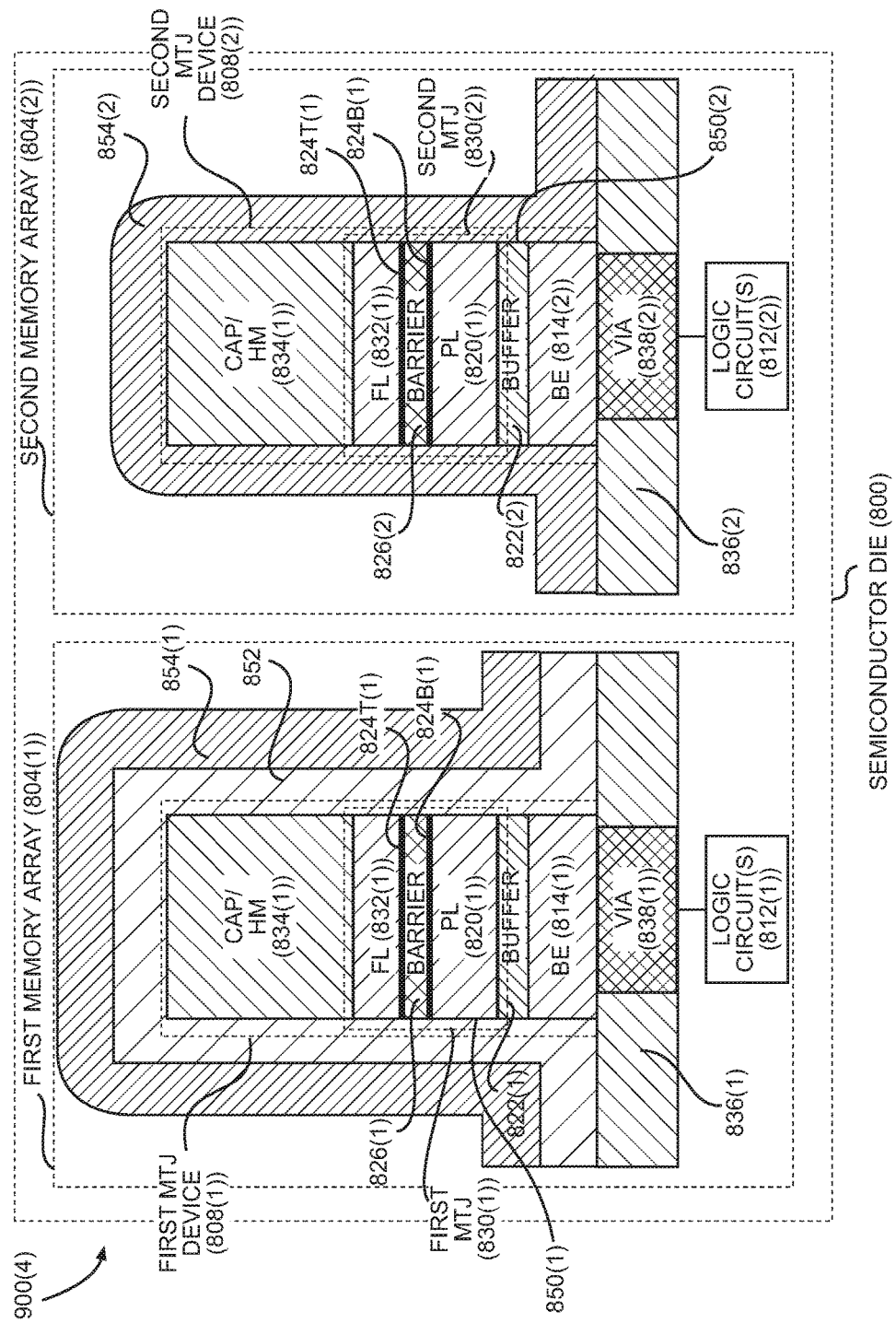
Figure 9E:
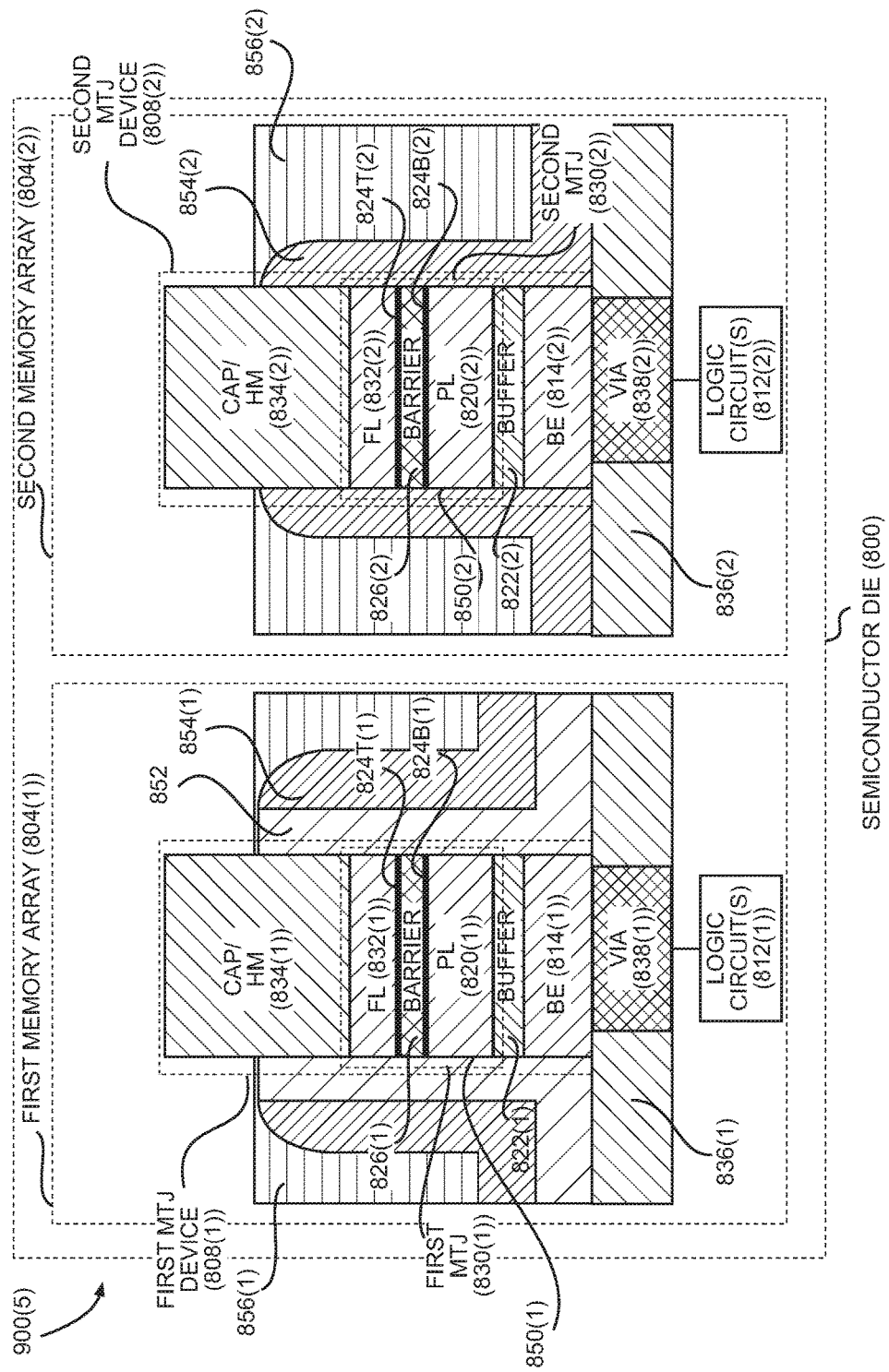
Figure 9F:
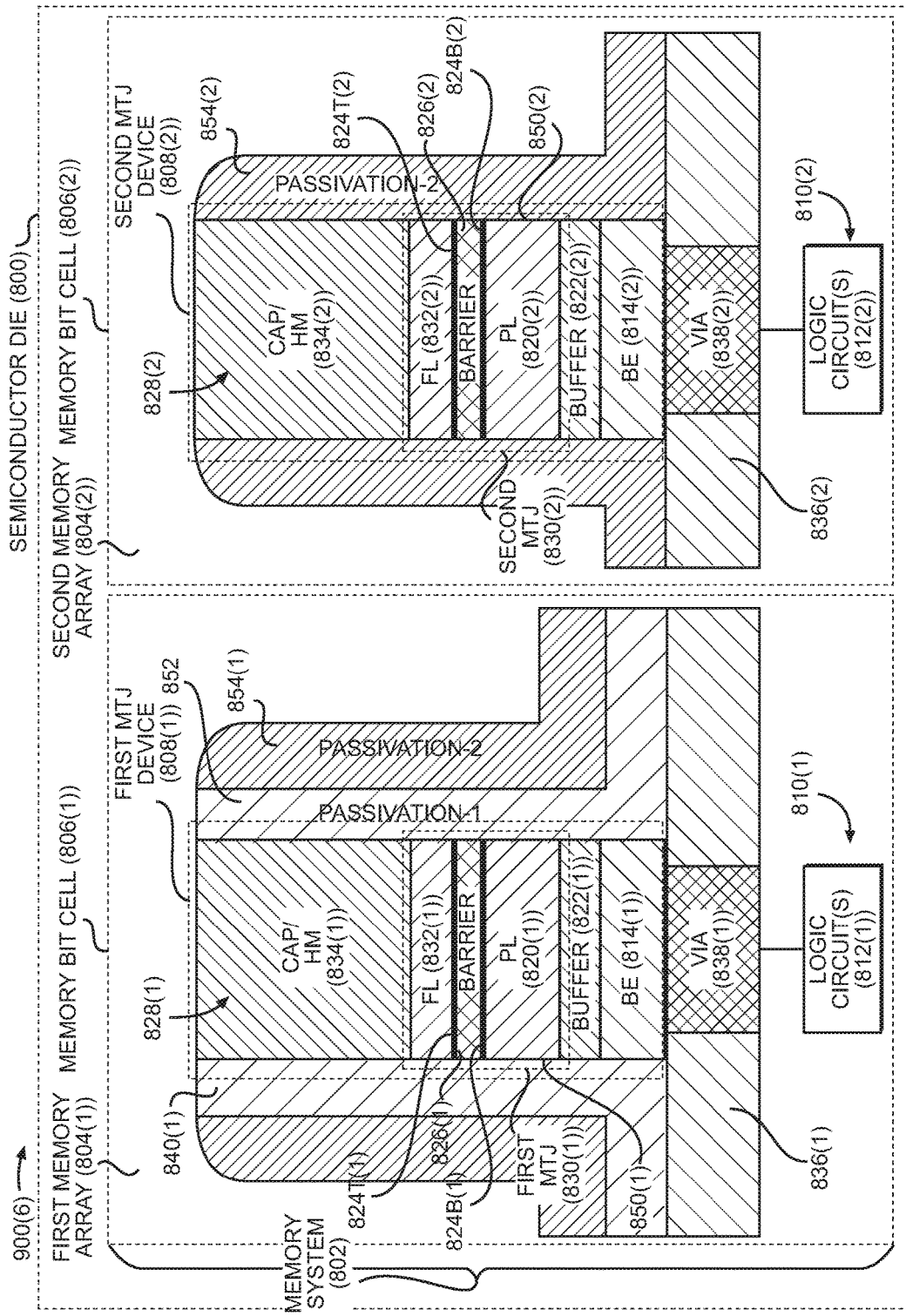

FIGS. 9A-9F illustrate side views of exemplary stages of fabricating the first and second MTJ devices 808(1), 808(2) in the memory arrays 804(1), 804(2) of the semiconductor die 800 in FIG. 8. In this regard FIG. 9A illustrates a first exemplary fabrication stage 900(1) of the semiconductor die 800 in FIG. 8. As shown therein, the material layers have been disposed or otherwise formed to form the first and second MTJ devices 808(1), 808(2) in the memory arrays 804(1), 804(2) of the semiconductor die 800. Note that although the MTJ devices 808(1), 808(2) in FIG. 9A are shown as being adjacent to each other, the MTJ devices 808(1), 808(2) have been formed in the different memory arrays 804(1), 804(2) in different areas of the semiconductor die 800.

In this regard, the MTJ devices 808(1), 808(2) include first and second bottom electrode materials 814M(1), 814M(2) disposed a first thickness at height $H_3$. The first and second bottom electrode materials 814M(1), 814M(2) can be formed from any conductive material. The bottom electrodes 814(1), 814(2) in the MTJ devices 808(1), 808(2) shown in FIG. 8 will be formed from the bottom electrode materials 814M(1), 814M(2). The bottom electrode materials 814M(1), 814M(2) are formed above the ILDs 836(1), 836(2). A first and second buffer material 822M(1), 822M(2) is disposed above the first and second bottom electrode material 814M(1), 814M(2). The first and second buffer materials 822M(1), 822M(2) prepare a material interface for first and second pinned layer materials 820M(1), 820M(2) disposed above the first and second buffer materials 822M(1), 822M(2) to be coupled to the first and second bottom electrode materials 814M(1), 814M(2). For example, the first and second buffer materials 822M(1), 822M(2) may be Tantalum (Ta), Tantalum Nitride (TaN), Titanium (Ti), Titanium Nitride (TiN), Ruthenium (Ru), Tungsten (W), Platinum (Pt), Palladium (Pd), Chromium (Cr), and/or Nickel Chromium (NiCR). Further, the first and second buffer materials 622M(1), 622M(2) can be a single layer or a multiple layer stack of multiple different layers of such materials, including alternating layers of such materials. To form the MTJs 830(1), 830(2), the first and second pinned layer materials 820M(1), 820M(2) are ferromagnetic materials, examples of which have been discussed above. First and second tunnel barrier materials 826M(1), 826M(2) are disposed above the first and second pinned layer materials 820M(1), 820M(2). Tunnel barrier interfaces 824B(1), 824B(2) are formed between first and second tunnel barrier materials 826M(1), 826M(2) and the first and second pinned layer materials 820M(1), 820M(2). The first and second tunnel barrier materials 826M(1), 826M(2) are dielectric materials, such as Magnesium (Mg) Oxide (0) (MgO), a Mg/MgO alloy or multi-layer stack, a MgO/Mg alloy or multi-layer stack, or a Mg/MgO/Mg alloy or multi-layer stack, as examples. First and second free layer material 832M(1), 832M(2) are disposed above the first and second tunnel barrier materials 826M(1), 826M(2). Tunnel barrier interfaces 824T(1), 824T(2) are formed between the first and second tunnel barrier materials 826M(1), 826M(2) and the first and second free layer materials 832M(1), 832M(2). A first and second hard mask material 834M(1), 834M(2) is disposed over the first and second free layer materials 832M(1), 832M(2) to protect the other underlying layers during further processing, such as etching, to form the MTJ devices 808(1), 808(2).

FIG. 9B illustrates an exemplary second fabrication stage 900(2) after material layers for the first and second MTJ devices 808(1), 808(2) are formed. The material layers for the MTJ device 808(1) have been processed, such as etched to form the first MTJ device 808(1). This prepares for a fabrication step to surround the first MTJ device 808(1) with the first passivation layer 852. The material layers for the second MTJ device 808(2) are not yet etched, because the first passivation layer 852 will not be formed around the second MTJ device 808(2).

FIG. 9C illustrates an exemplary third fabrication stage 900(3) after material layers for the first MTJ device 808(1) have been etched. The first passivation layer 852 is disposed around the first MTJ device 808(1) to protect the material layers therein from being shorted to other conductive materials, such as through metal redeposition or other conductive structures formed in the semiconductor die 800. As an example, the first passivation layer 852 may be an oxide-based insulator or oxygen gettering insulator that serves as a reduced quality insulator to protect a side wall 850(1) of the first MTJ device 808(1). For example, the first passivation layer 852 may be a Silicon Nitride (SiN), Silicon Oxide (SiO$_2$), an Aluminum Oxide (AlOx), or a Silicon-Oxy (SiON) material. Thus, this first passivation layer 852 will allow some damage to occur to the side wall 850(1) when further etching is performed to form the second MTJ device 808(2) from its material layers shown in FIG. 9C.

FIG. 9D illustrates an exemplary fourth fabrication stage 900(4) where second passivation layers 854(1), 854(2) are formed around the MTJ devices 808(1), 808(2) to protect them during further processing. The second passivation layer 854(1) surrounds the first passivation layer 852 for the first MTJ device 808(1). The second passivation layer 854(2) directly surrounds the second MTJ device 808(2). Thus, the second passivation layer 854(2) protects the second MTJ device 808(2) from incurring the defect or damage introduced in the tunnel barrier interface 824T(1) and/or 824B(1) of the first MTJ device 808(1) such that the breakdown voltage of the second MTJ device 808(2) will be higher than the breakdown voltage of the first MTJ device 808(1).

FIG. 9E illustrates an exemplary fifth fabrication stage 900(5) where the first and second passivation layers 852, 854(1), 854(2) are removed at the hard masks 834(1), 834(2) and a further dielectric material 856(1), 856(2) is disposed around the second passivation layers 854(1), 854(2) to further insulate the first and second MTJ devices 808(1), 808(2). FIG. 9F illustrates an exemplary sixth fabrication stage 900(6) where the first and second passivation layers 852, 854(1), 854(2) are removed at the hard masks 834(1), 834(2) and a further dielectric material 856(1), 856(2) is disposed around the second passivation layers 854(1), 854(2) to further insulate the first and second MTJ devices 808(1), 808(2).

Note that alternatively, the first and second passivation layers 852, 854(1), 854(2) could be the same type of material to provide insulation to the first and second MTJ devices 808(1), 808(2). After the etching of the first MTJ device 808(1), a side wall treatment could be performed on the side wall 850(1) of the first MTJ device 808(1) to introduce a defect or damage in the tunnel barrier interface 824T(1) and/or 824B(1).

FIG. 10 is a side view of another exemplary semiconductor die 1000 that includes a memory system 1002 that includes different first and second memory arrays 1004(1), 1004(2) each having respective first and second memory bit cells 1006(1), 1006(2) with varied breakdown voltages in different memory arrays 1004(1), 1004(2) fabricated in the same semiconductor die 1000 to facilitate different memory applications. Each memory bit cell 1006(1), 1006(2) includes a respective first and second MTJ device 1008(1), 1008(2) and first and second access transistor 1010(1), 1010(2) provided in a logic circuit 1012(1), 1012(2). Note that although only two memory bit cells 1006(1), 1006(2) are shown in FIG. 10, each of the first and second memory arrays 1004(1), 1004(2) may include a plurality of respective first and second memory bit cells 1006(1), 1006(2). In this example of the semiconductor die 1000 in FIG. 10, as will be discussed in more detail below, to vary the breakdown voltages of the first and/or second MTJ devices 1008(1), 1008(2) to be different so that the first and second memory bit cells 1006(1), 1006(2) in the first and second memory arrays 1004(1), 1004(2) will have different breakdown voltages for different applications, an implantation is introduced in a tunnel barrier 1026(1) of the first MTJ device 1008(1) during fabrication to roughen a tunnel barrier interface 1024T(1) and/or 1024B(1) to weaken its dielectric, thus reducing the breakdown voltage of the first MTJ device 1008(1) over the second MTJ device 1008(2). This has the effect of reducing the quality of the tunnel barrier interface 1024T(1) and/or 1024B(1) of the MTJ device 1008(1) to decrease TMR, thus decreasing breakdown voltage of the first MTJ device 1008(1) in the first memory array 1004(1) as compared to the second MTJ device 1008(2) in the second memory array 1004(2). For example, roughening the tunnel barrier interface 1024T(1) and/or 1024B(1) can create thinner areas allowing for electrons to tunnel through the tunnel barrier 1026(1) more easily, thus reducing breakdown voltage.

With continuing reference to FIG. 10, the first and second MTJ devices 1008(1), 1008(2) are fabricated from various material layers. The first and second MTJ devices 1008(1), 1008(2) in this example include respective first and second bottom electrodes 1014(1), 1014(2), first and second hard masks ("CAP/HM") 1034(1), 1034(2), and first and second MTJs 1030(1), 1030(2) disposed therebetween and coupled to the respective first and second bottom electrodes 1014(1), 1014(2) and the hard masks 1034(1), 1034(2). The first and second bottom electrodes 1014(1), 1014(2) are coupled to respective access transistors 1010(1), 1010(2). The first and second MTJs 1030(1), 1030(2) in this example include a respective first and second pinned magnetization layer ("pinned layer) 1020(1), 1020(2), a respective first and second free magnetization layer ("free layer") 1032(1), 1032(2), and a first and second respective tunnel barrier 1026(1), 1026(2). For example, the first and second pinned layer 1020(1), 1020(2) and the first and second free layer 1032(1), 1032(2) are formed from ferromagnetic materials that may be materials described above. The first and second pinned layers 1020(1), 1020(2) and free layers 1032(1), 1032(2) are formed from a ferromagnetic material that has a magnetic moment. The first and second MTJs 1030(1), 1030(2) are fabricated such that the magnetic moments of the pinned layers 1020(1), 1020(2) are in a fixed, pinned direction, whereas the magnetic moment of the free layers 1032(1), 1032(2) can be changed. The tunnel barriers 1026(1), 1026(2) are a dielectric material, such as Magnesium Oxide (MgO) for example. The first and second hard masks 1034(1), 1034(2) are disposed above and in contact with the respective free layers 1032(1), 1032(2) and top electrodes 1028(1), 1028(2). The first and second hard masks 1034(1), 1034(2) protect the MTJ devices 1008(1), 1008(2) during etching or other fabrication processes (e.g., ion beam etching (IBE)) to form the MTJ devices 1008(1), 1008(2) and its various materials layers from materials disposed above interlayer dielectrics (ILD) 1036(1), 1036(2) that provide isolation for the logic circuits 1012(1), 1012(2) from upper metal layers. Vertical interconnect accesses (vias) 1038(1), 1038(2) can be formed in the ILDs 1036(1), 1036(2) to provide connections between the MTJ devices 1008(1), 1008(2) and the logic circuits 1012(1), 1012(2).

The first and second memory arrays 1004(1), 1004(2) employing the first and second MTJ devices 1008(1), 1008 (2) with different breakdown voltages can be fabricated to achieve different tradeoffs between breakdown voltage and endurance for the first and second memory bit cells 1006(1), 1006(2). For example, it may be desired to fabricate the first memory array 1004(1) in the semiconductor die 1000 as an OTP memory array using first MTJ devices 1008(1) having a first breakdown voltage, and fabricate a separate MRAM memory array with second MTJ devices 1008(2) having a higher breakdown voltage. As an example, memory array 1004(1) may be an OTP memory array having memory bit cells 1006(1) with its first MTJ devices 1008(1) having a lower breakdown voltage (e.g., 1.2 V), than the MTJ devices 1008(2) having a higher breakdown voltage (e.g., 1.6 V) in the second memory bit cells 1006(2).

Figure 11A:
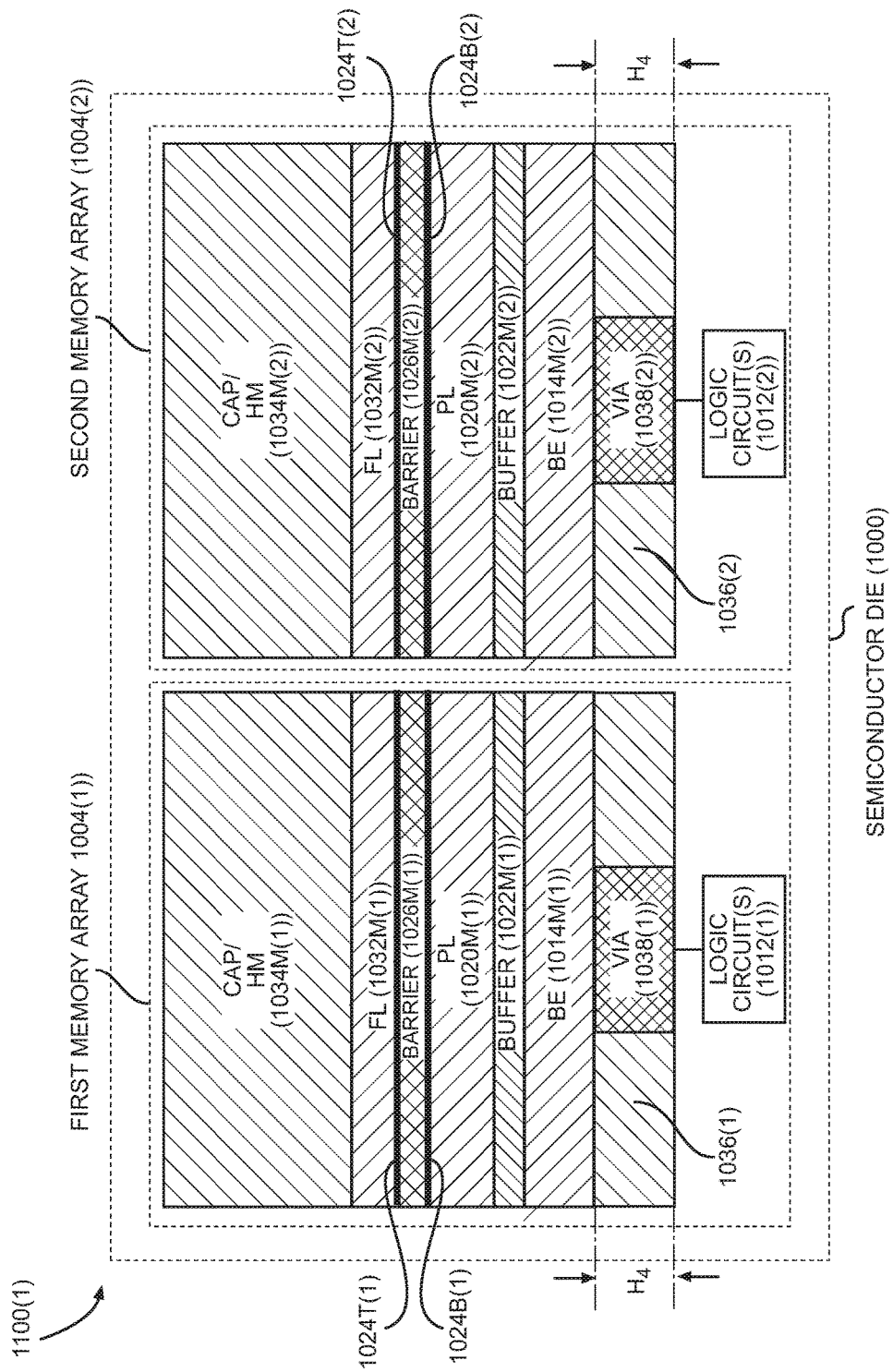
FIGS. 11A-11F illustrate side views of exemplary stages of fabricating the MTJ devices in the semiconductor die in FIG. 10.
Figure 11B:
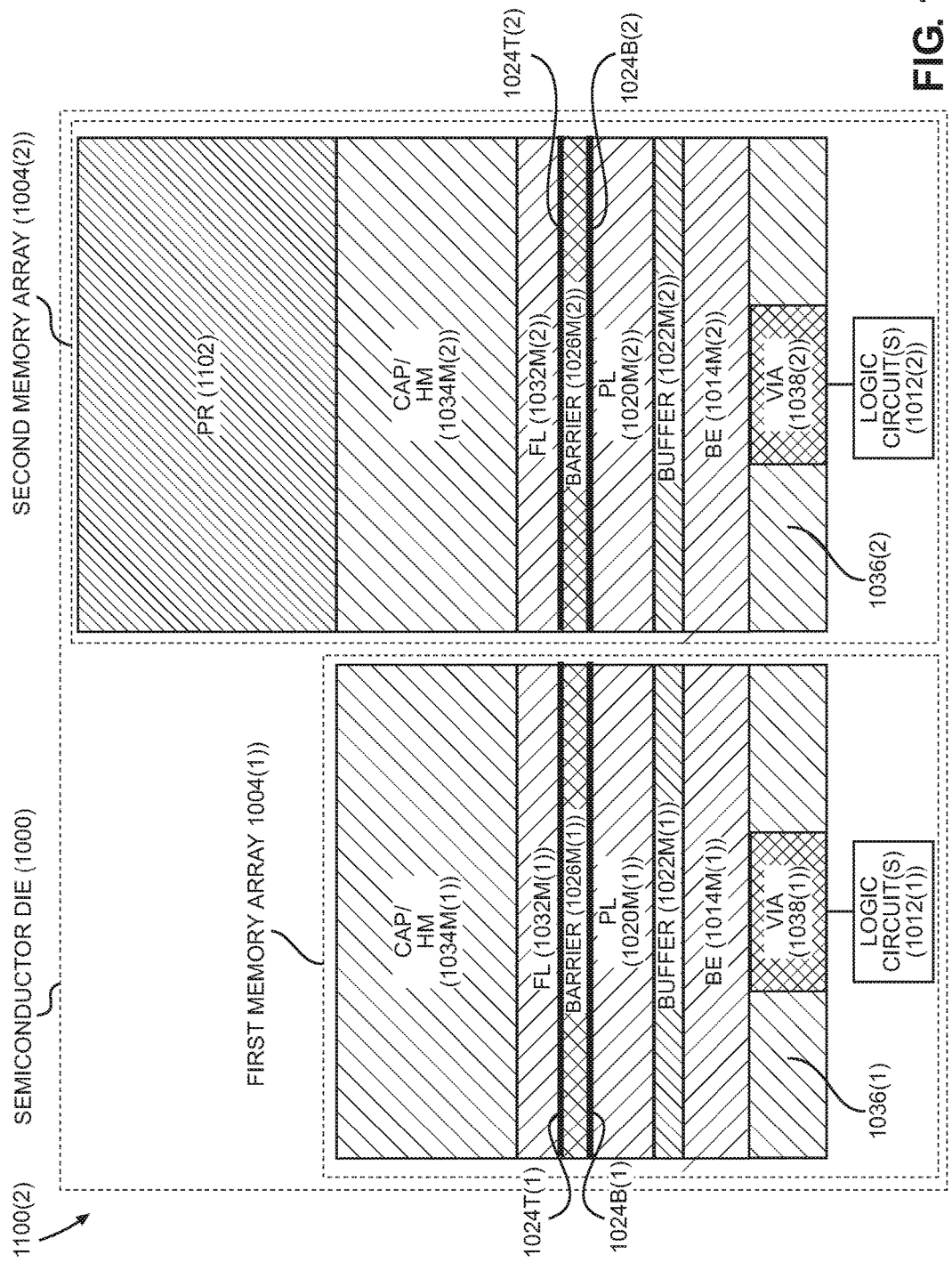
Figure 11C:
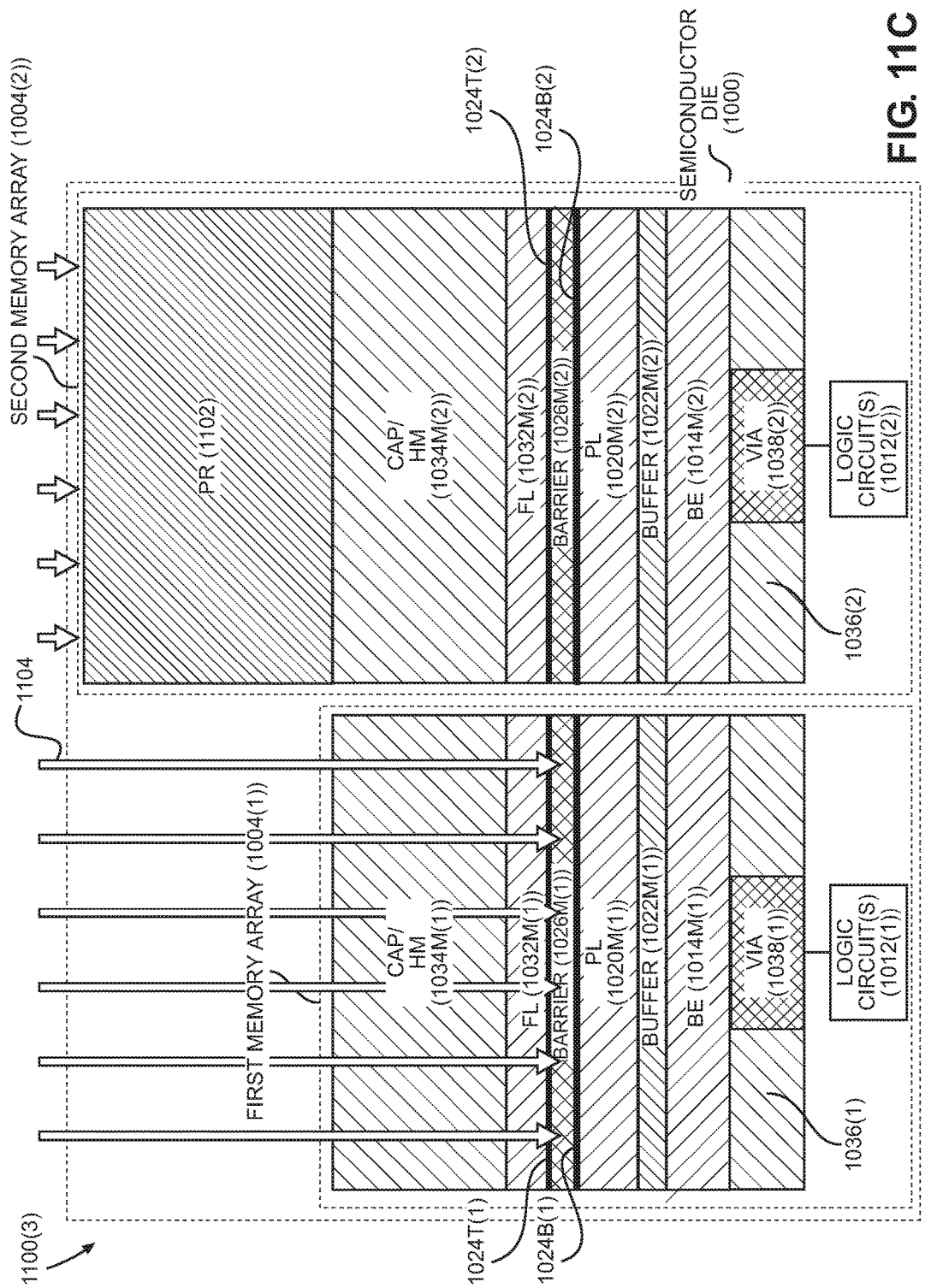
Figure 11D:
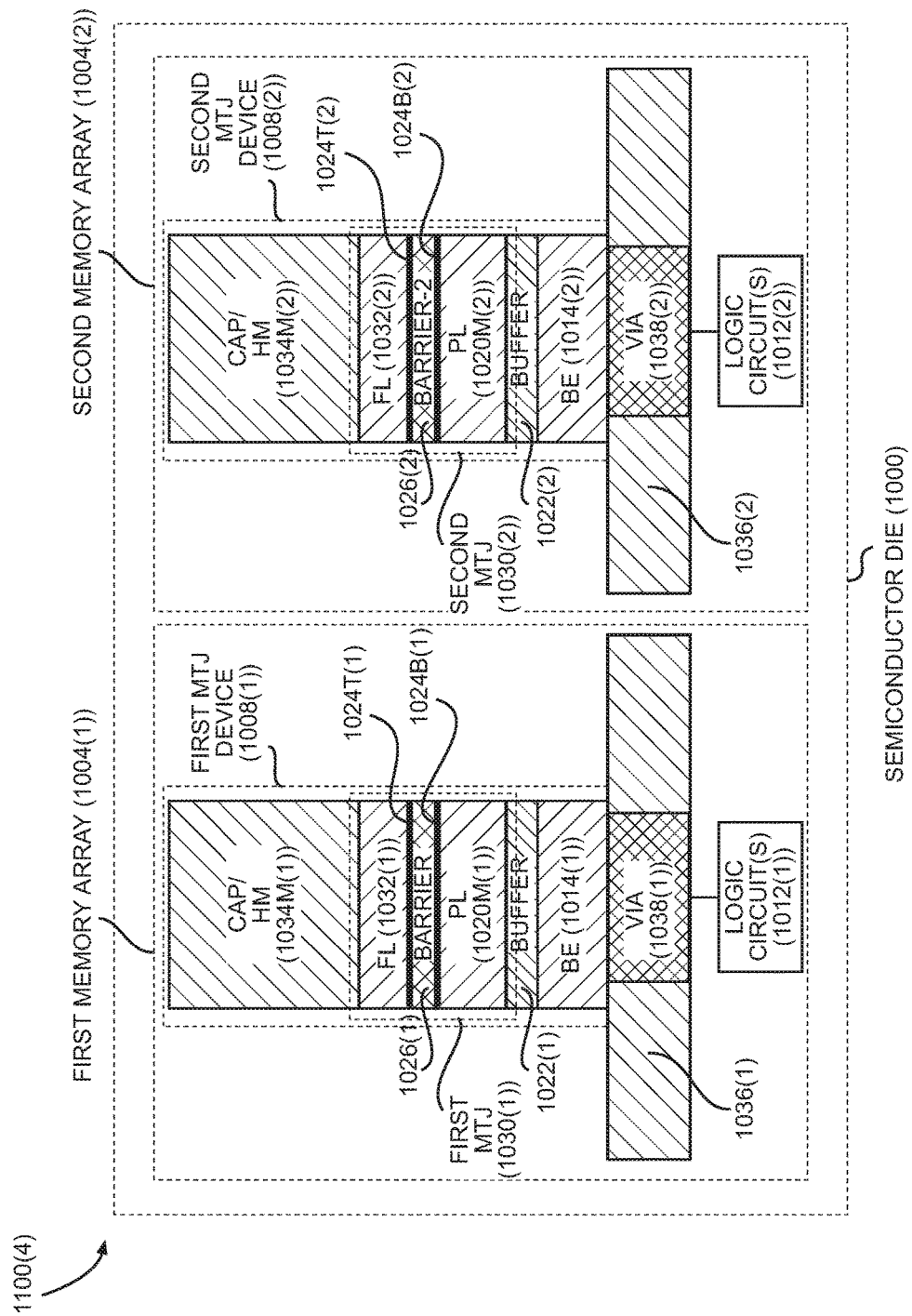
Figure 11E:
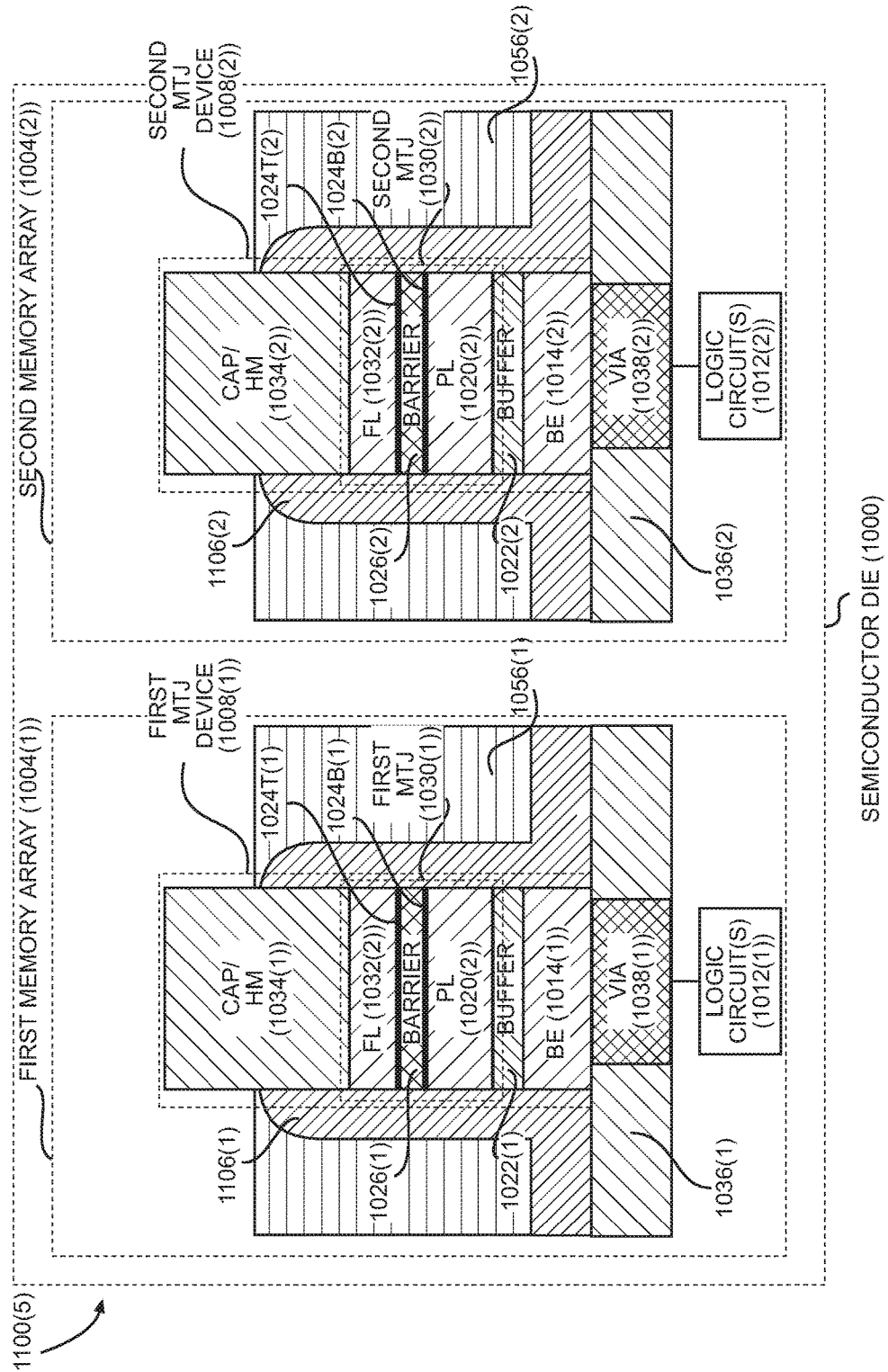
Figure 11F:
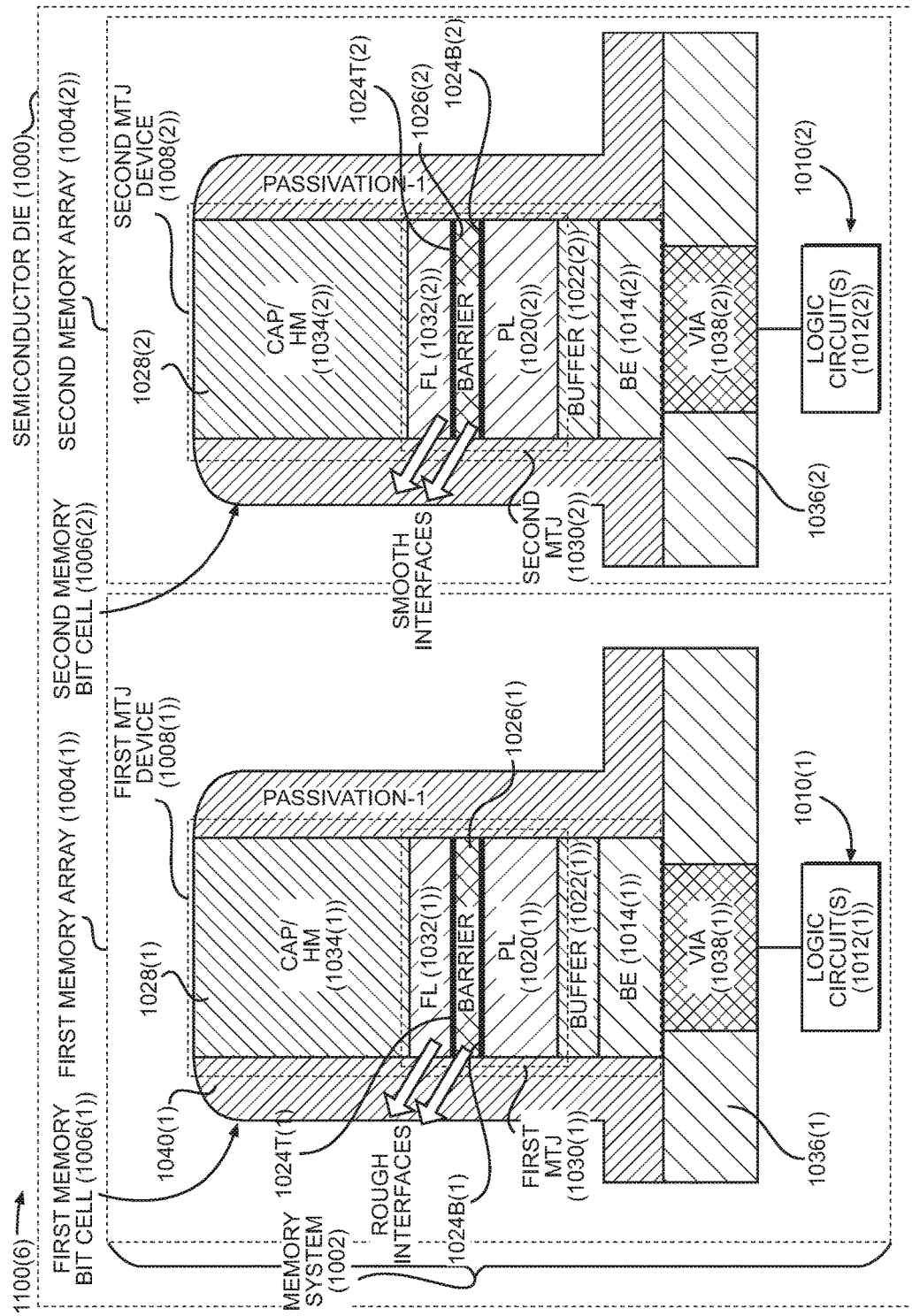

FIGS. 11A-11F illustrate side views of exemplary stages of fabricating the first and second MTJ devices 1008(1), 1008(2) in the memory arrays 1004(1), 1004(2) of the semiconductor die 1000 in FIG. 10. In this regard FIG. 11A illustrates a first exemplary fabrication stage 1100(1) of the semiconductor die 1000 in FIG. 10. As shown therein, the material layers have been disposed or otherwise formed to form the first and second MTJ devices 1008(1), 1008(2) in the memory arrays 1004(1), 1004(2) of the semiconductor die 1000. Note that although the MTJ devices 1008(1), 1008(2) in FIG. 11A are shown as being adjacent to each other, the MTJ devices 1008(1), 1008(2) have been formed in the different memory arrays 1004(1), 1004(2) in different areas of the semiconductor die 1000.

In this regard, the MTJ devices 1008(1), 1008(2) include first and second bottom electrode materials 1014M(1), 1014M(2) disposed a first thickness at height $H_4$. The first and second bottom electrode materials 1014M(1), 1014M(2) can be formed from any conductive material. The bottom electrodes 1014(1), 1014(2) in the MTJ devices 1008(1), 1008(2) shown in FIG. 10 will be formed from the bottom electrode materials 1014M(1), 1014M(2). The bottom electrode materials 1014M(1), 1014M(2) are formed above the ILDs 1036(1), 1036(2). A first and second buffer material 1022M(1), 1022M(2) is disposed above the first and second bottom electrode material 1014M(1), 1014M(2). The first and second buffer material 1022M(1), 1022M(2) prepare a material interface for first and second pinned layer materials 1020M(1), 1020M(2) disposed above the first and second buffer material 1022M(1), 1022M(2) to be coupled to the first and second bottom electrode materials 1014M(1), 1014M(2). For example, the first and second buffer material 1022M(1), 1022M(2) may be Tantalum (Ta), Tantalum Nitride (TaN), Titanium (Ti), Titanium Nitride (TiN), Ruthenium (Ru), Tungsten (W), Platinum (Pt), Palladium (Pd), Chromium (Cr), and/or Nickel Chromium (NiCR). Further, the first and second buffer materials 622M(1), 622M(2) can be a single layer or a multiple layer stack of multiple different layers of such materials, including alternating layers of such materials. To form the MTJs 1030(1), 1030(2), the first and second pinned layer materials 1020M(1), 1020M(2) are ferromagnetic materials, which can include any of the ferromagnetic material examples discussed previously. First and second tunnel barrier material 1026M(1), 1026M(2) are disposed above the first and second pinned layer material 1020M(1), 1020M(2). Tunnel barrier interfaces 1024B(1), 1024B(2) are formed between the first and second tunnel barrier material 1026M(1), 1026M(2) and the first and second pinned layer material 1020M(1), 1020M(2). The first and second tunnel barrier material 1026M(1), 1026M(2) are dielectric materials, such as Magnesium Oxide (MgO) for example. A first and second free layer material 1032M(1), 1032M(2) are disposed above the first and second tunnel barrier materials 1026M(1), 1026M(2). Tunnel barrier interfaces 1024T(1), 1024T(2) are formed between the first and second tunnel barrier material 1026M (1), 1026M(2) and the first and second free layer material 1032M(1), 1032M(2). A first and second hard mask material 1034M(1), 1034M(2) is disposed over the first and second free layer materials 1032M(1), 1032M(2) to protect the other underlying layers during further processing, such as etching, to form the MTJ devices 1008(1), 1008(2).

FIG. 11B illustrates an exemplary second fabrication stage 1100(2) to prepare an implantation to be introduced into the first tunnel barrier 1026(1) of the first MTJ device 1008(1). A photoresist layer (PR) 1102 is disposed over the second hard mask material 1034M(2) to protect the material layers of the second MTJ device 1008(2).

FIG. 11C illustrates an exemplary third fabrication stage 1100(3) wherein an ion implantation 1104 is directed towards the hard mask materials 1034M(1), 1034M(2) of the MTJ devices 1008(1), 1008(2). The photoresist layer 1102 blocks the tunnel barrier interfaces 1024T(2), 1024B(2) of the second MTJ device 1008(2) from receiving the ion implantation 1104 and thus from being damaged or roughened, but the ion implantation 1104 will reach the tunnel barrier interfaces 1024T(1), 1024B(1) of the first MTJ device 1008(1). However, with the first MTJ device 1008(1) being unblocked with the photoresist layer 1102, the ion implantation 1104 is will reach the tunnel barrier interfaces 1024T(1), 1024B(1) of the first MTJ device 1008(1) causing them to be damaged and/or roughened. For example, the ion implantation 1104 may be a Nitrogen (N), Helium (He), Boron (B), Carbon (C), Argon (Ar), Silicon (Si), Cobalt (Co), Nickel (Ni), Iron (Fe), Hafnium (Hf), or Tantalum (Ta) ion implantation 1104. The exposure of the tunnel barrier interfaces 1024T(1), 1024B(1) of the first MTJ device 1008(1) to the ion implantation 1104 results in greater current leakage across the tunnel barrier 1026(1), thus reducing breakdown voltage. Roughening tunnel barrier interfaces 1024T(1), 1024B(1) can also decrease the quality of the tunnel barrier interface 1024T(1), 1024B(1) to the tunnel barrier 1026(1) for the first MTJ device 1008(1), thereby reducing TMR and breakdown voltage as a result.

FIG. 11D illustrates an exemplary fourth fabrication stage 1100(4) where the material layers of the first and second MTJ devices 1008(1), 1008(2) have been etched to form the first and second MTJ devices 1008(1), 1008(2). FIG. 11E illustrates an exemplary fifth fabrication stage 1100(5) where a further dielectric material 1056(1), 1056(2) is disposed around the first and second MTJ devices 1008(1), 1008(2) to further insulate them. FIG. 11F illustrates an exemplary sixth fabrication stage 1100(6) where the MTJ devices 1008(1), 1008(2) are fully formed in their respective memory arrays 1004(1), 1004(2), like shown in FIG. 10.

Semiconductor dies that include different MTJ-based memory arrays fabricated therein that each include memory bit cells that include MTJs, wherein the breakdown voltages between the MTJs in the memory bit cells in different memory arrays is varied and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
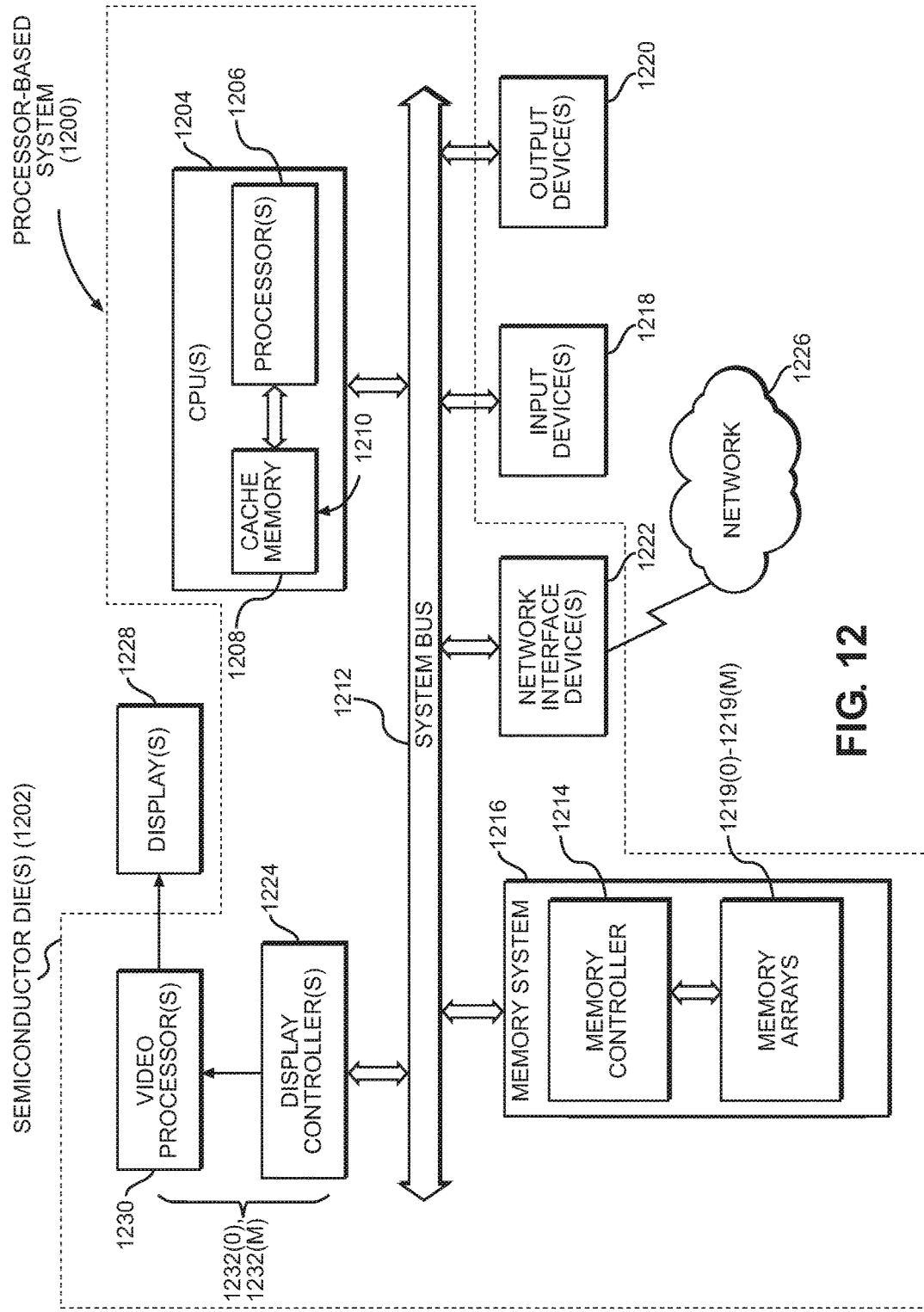
FIG. 12 is a block diagram of an exemplary processor-based system that can include memory arrays in a same semiconductor die comprising memory bit cells with varied breakdown voltages in different memory arrays to facilitate different memory applications, like for example the memory arrays in FIGS. 3, 4, 6, and 10.

In this regard, FIG. 12 illustrates an example of a processor-based system 1200 that can include a semiconductor die(s) 1202 that include different MTJ-based memory arrays fabricated therein that each include memory bit cells that include MTJs, wherein the breakdown voltages between the MTJs in the memory bit cells in different MTJ-based memory arrays is varied and according to aspects disclosed herein, including but not limited to the memory arrays 304(1), 304(2), 604(1), 604(2), 804(1), 804(2), 1004(1), 1004(2) in FIGS. 3, 4, 6, and 10. In this example, the processor-based system 1200 includes one or more CPUs 1204, each including one or more processors 1206. The CPU(s) 1204 may have cache memory 1208 coupled to the processor(s) 1206 for rapid access to temporarily stored data. The cache memory 1208 may include multiple MTJ-based memory arrays 1210, like the MTJ-based memory arrays 304(1), 304(2), 604(1), 604(2), 804(1), 804(2), 1004(1), 1004(2) in FIGS. 3, 4, 6, and 10 for example, wherein the breakdown voltages between the MTJs in the memory bit cells in different MTJ-based memory arrays 1210 is varied. The CPU(s) 1204 is also coupled to a system bus 1212 and can intercouple master and slave devices included in the processor-based system 1200. As is well known, the CPU(s) 1204 communicates with these other devices by exchanging address, control, and data information over the system bus 1212. For example, the CPU(s) 1204 can communicate bus transaction requests to a memory controller 1214 in a memory system 1216 as an example of a slave device. The memory system 1216 can include one or more memory arrays 1219(0)-1219(M) that include MTJ-based memory bit cells, like the MTJ-based memory arrays 304(1), 304(2), 604(1), 604(2), 804(1), 804(2), 1004(1), 1004(2) in FIGS. 3, 4, 6, and 10 for example, wherein the breakdown voltages between the MTJs in the memory bit cells in different MTJ-based memory arrays is varied. Although not illustrated in FIG. 12, multiple system buses 1212 could be provided, wherein each system bus 1212 constitutes a different fabric.

Other master and slave devices can be connected to the system bus 1212. As illustrated in FIG. 12, these devices can include the memory system 1216, one or more input devices 1218, one or more output devices 1220, one or more network interface devices 1222, and one or more display controllers 1224, as examples. The input device(s) 1218 can include any type of input device, including, but not limited to, input keys, switches, voice processors, etc. The output device(s) 1220 can include any type of output device, including, but not limited to, audio, video, other visual indicators, etc. The network interface device(s) 1222 can be any device configured to allow exchange of data to and from a network 1226. The network 1226 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1222 can be configured to support any type of communications protocol desired.

The CPU(s) 1204 may also be configured to access the display controller(s) 1224 over the system bus 1212 to control information sent to one or more displays 1228. The display controller(s) 1224 sends information to the display(s) 1228 to be displayed via one or more video processors 1230, which process the information to be displayed into a format suitable for the display(s) 1228. The display(s) 1228 can include any type of display, including, but not limited to, a cathode ray tube (CRT), a liquid crystal display (LCD), a plasma display, a light emitting diode (LED) display, etc. Any of the display controller(s) 1224, display(s) 1228, and/or the video processor(s) 1230 can include one or more memory arrays 1232(0)-1232(M) that include MTJ-based memory bit cells, like the memory arrays 304(1), 304(2), 604(1), 604(2), 804(1), 804(2), 1004(1), 1004(2) in FIGS. 3, 4, 6, and 10 for example, wherein the breakdown voltages between the MTJs in the memory bit cells in different memory arrays is varied. Each of the components in the processor-based system 1200 in FIG. 12 can be included on the same, single semiconductor die 1202, or arranged on different semiconductor dies 1202. For example, the processor-based system 1200 in FIG. 12 may be included in a single semiconductor die 1202 as a system-on-a-chip (SoC).

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor die, comprising:
a first memory array comprising a first plurality of memory bit cells each comprising a first magnetic tunnel junction (MTJ) device comprising:
a first bottom electrode; and
a first MTJ disposed above the first bottom electrode, the first MTJ comprising:
a first pinned layer having a first pinned layer magnetic moment;
a first free layer having a first free layer magnetic moment; and
a first tunnel barrier disposed between the first pinned layer and the first free layer, wherein the first MTJ has a first breakdown voltage; and
a second memory array comprising a second plurality of memory bit cells each comprising a second MTJ device comprising:
a second bottom electrode; and
a second MTJ disposed above the second bottom electrode, the second MTJ comprising:
a second pinned layer having a second pinned layer magnetic moment;
a second free layer having a second free layer magnetic moment; and
a second tunnel barrier disposed between the second pinned layer and the second free layer, wherein the second MTJ has a second breakdown voltage less than the first breakdown voltage.

2. The semiconductor die of claim 1, wherein the first breakdown voltage is between approximately 1.2 and 2.0 Volts (V), and the second breakdown voltage is between approximately 0.6 and 1.2 V.

3. The semiconductor die of claim 1, wherein a ratio of the first breakdown voltage to the second breakdown voltage is between approximately 1.1 and 1.3.

4. The semiconductor die of claim 1, wherein:
the first MTJ has a first tunnel magneto-resistive ratio (TMR); and
the second MTJ has a second TMR less than the first TMR.

5. The semiconductor die of claim 4, wherein a ratio of the first TMR to the second TMR is between approximately 1.0 and 1.5.

6. The semiconductor die of claim 1, wherein the first bottom electrode is of a first thickness, and the second bottom electrode is of a second thickness less than the first thickness.

7. The semiconductor die of claim 6, wherein a ratio of the first thickness to the second thickness is between approximately 1.1 and 2.5.

8. The semiconductor die of claim 1, wherein a top surface of the first bottom electrode has a root mean squared roughness of approximately 0.5 Angstroms (A) or less.

9. The semiconductor die of claim 1, further comprising:
a first passivation layer comprising a first passivation material disposed adjacent to the second MTJ;
a second passivation layer comprising a second passivation material disposed adjacent to the first passivation layer; and
a third passivation layer comprising the second passivation material disposed adjacent to the first MTJ.

10. The semiconductor die of claim 9, wherein the first passivation layer comprises an oxide-based material passivation layer.

11. The semiconductor die of claim 9, wherein the first passivation material is comprised from the group consisting of Silicon Nitride (SiN), Silicon Oxide ($SiO_2$), Aluminum Oxide (AlOx), and Silicon-Oxynitride (SiON).

12. The semiconductor die of claim 1, wherein the first tunnel barrier comprises an ion implantation, and the second tunnel barrier does not comprise an ion implantation.

13. The semiconductor die of claim 1, wherein:
the first memory array comprises a One-Time-Programmable (OTP) memory array, wherein the first plurality of memory bit cells comprise a plurality of OTP memory bit cells; and
the second memory array comprises a magneto-resistive random access memory (MRAM) memory array, wherein the second plurality of memory bit cells comprise a plurality of MRAM bit cells.

14. The semiconductor die of claim 13, wherein each OTP memory bit cell among the plurality of OTP memory bit cells further comprises:
a first access transistor coupled to the first bottom electrode of the first MTJ, the first access transistor comprising a drain node, a source node, and a gate node coupled to a word line.

15. The semiconductor die of claim 13, wherein each MRAM bit cell among the plurality of MRAM bit cells further comprises:

a second access transistor coupled to the second bottom electrode of the second MTJ, the second access transistor comprising a drain node, a source node, and a gate node coupled to a word line.

16. The semiconductor die of claim 1 integrated into an integrated circuit (IC).

17. The semiconductor die of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A method of fabricating memory bit cells in a semiconductor die, comprising:
forming a first MTJ device in a first memory array, comprising:
forming a first bottom electrode from a first bottom electrode material;
forming a first MTJ above the first bottom electrode, the first MTJ comprising a first pinned layer, a first free layer, and a first tunnel barrier material formed between the first pinned layer and the first free layer;
forming a second MTJ device in a second memory array, comprising:
forming a second bottom electrode from a second bottom electrode material;
forming a second MTJ above the second bottom electrode, the second MTJ comprising a second pinned layer, a second free layer, and a second tunnel barrier material formed between the second pinned layer and the second free layer;
causing a defect to be formed in the second tunnel barrier material such that a second breakdown voltage of the second MTJ is less than a first breakdown voltage of the first MTJ.

19. The method of claim 18, wherein a ratio of the first breakdown voltage to the second breakdown voltage is between approximately 1.1 and 1.3.

20. The method of claim 18, wherein causing the defect to be formed in the second tunnel barrier material comprises treating a second top surface of the second bottom electrode to increase a roughness of the second top surface of the second bottom electrode.

21. The method of claim 20, wherein causing the defect to be formed in the second tunnel barrier material comprises plasma-treating the second top surface of the second bottom electrode to increase the roughness of the second top surface of the second bottom electrode.

22. The method of claim 21, further comprising:
applying a photoresist layer above a first bottom electrode before treating the second top surface of the second bottom electrode to substantially planarize a first top surface of the first bottom electrode; and
removing the photoresist layer after treating the second top surface of the second bottom electrode to substantially planarize the first top surface of the first bottom electrode.

23. The method of claim 18, wherein:
forming the first MTJ device further comprises treating a first top surface of a first bottom electrode to substantially planarize the first top surface of the first bottom electrode; and
causing the defect to be formed in the second tunnel barrier material comprises not planarizing a second top surface of a second bottom electrode.

24. The method of claim 23, further comprising:
applying a photoresist layer above the second bottom electrode before treating the first top surface of the first bottom electrode to substantially planarize the first top surface of the first bottom electrode; and
removing the photoresist layer after treating the first top surface of the first bottom electrode to substantially planarize the first top surface of the first bottom electrode.

25. The method of claim 23, wherein substantially planarizing the first top surface of the first bottom electrode further comprises reducing a first thickness of the first bottom electrode to be less than a second thickness of the second bottom electrode.

26. The method of claim 18, wherein causing the defect to be formed in the second tunnel barrier material comprises reducing a first thickness of a first bottom electrode to be less than a second thickness of a second bottom electrode.

27. The method of claim 18, wherein causing the defect to be formed in the second tunnel barrier material comprises:
forming a first passivation layer comprising a first passivation material adjacent to the second MTJ; and
etching the first MTJ in an MTJ material stack exposing the first passivation layer to etching such that the second tunnel barrier material is partially etched.

28. The method of claim 27, further comprising:
forming a second passivation layer comprising a second passivation material adjacent to the first passivation layer adjacent to the second MTJ; and
forming a third passivation layer comprising the second passivation material adjacent to the first MTJ.

29. The method of claim 27, wherein forming the first passivation layer comprises forming an oxide-based material passivation layer adjacent to the second MTJ.

30. The method of claim 18, wherein causing the defect to be formed in the second tunnel barrier material comprises implanting ions in the second tunnel barrier material of the second MTJ.

31. The method of claim 30, further comprising:
applying a photoresist layer above a first bottom electrode for implanting the ions in the second tunnel barrier material of the second MTJ; and
removing the photoresist layer after implanting the ions in the second tunnel barrier material of the second MTJ.

* * * * *